(12) United States Patent
Tsuto

(10) Patent No.: US 6,484,282 B1
(45) Date of Patent: Nov. 19, 2002

(54) TEST PATTERN GENERATOR, A MEMORY TESTING DEVICE, AND A METHOD OF GENERATING A PLURALITY OF TEST PATTERNS

(75) Inventor: Masaru Tsuto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/418,758

(22) Filed: Oct. 15, 1999

(30) Foreign Application Priority Data

Oct. 16, 1998 (JP) ............................................ 10-295157

(51) Int. Cl.⁷ ......................... G01R 31/28; G06F 11/00; G11C 29/00
(52) U.S. Cl. ...................... 714/738; 714/738; 714/718; 714/719; 714/720
(58) Field of Search ................................ 714/718, 719, 714/720, 721, 724, 733, 738

(56) References Cited

U.S. PATENT DOCUMENTS 5,062,109 A * 10/1991 Oshima et al. ............. 714/719
5,216,673 A * 6/1993 Kanai .......................... 714/719
5,432,797 A * 7/1995 Takano ........................ 714/718
5,781,718 A * 7/1998 Nguyen ........................ 714/33
5,889,786 A * 3/1999 Shimogama ................. 714/720
6,219,806 B1 * 4/2001 Ogiwara ...................... 714/718

* cited by examiner

Primary Examiner—Emmanuel L. Moise
(74) Attorney, Agent, or Firm—Rosenthal & Osha L.L.P.

(57) ABSTRACT

A test pattern generator for generating a plurality of test patterns to test a memory comprising: a control memory for storing plural kinds of control instructions to generate the test patterns; a vector memory for storing vector instructions indicating an order of the control instructions to be read out from the control memory; a plurality of bank memories for alternately storing vector instructions read out from vector memory and bank memories; an address expander for generating an address of each of control instructions in control memory in accordance with vector instructions stored in a plurality of bank memories; and a test pattern calculator for generating test patterns based on control instructions read out from an address generated by an address expander stored in the control memory.

66 Claims, 16 Drawing Sheets

32

| ADDRESS | ADDRESS CONTROL MEMORY 32a | DATA CONTROL MEMORY 32b | READ WRITE CONTROL MEMORY 32c |
|---|---|---|---|
| #0 | XB<0 | TP<0 | |
| #1 | XB<XB+1 | TP<TP | W |
| #2 | XB<XB | TP<TP | R |
| #3 | XB<XB+1 | TP<TP | /D W |
| #4 | XB<XB | TP<TP | R |
| #5 | XB<XB+1 | TP</TP | /D W |
| #6 | XB<XB | TP<TP | |

*FIG.2*

| ADDRESS | SEQUENCE CONTROL INSTRUCTION | ADDRESS CONTROL INSTRUCTION | DATA CONTROL INSTRUCTION | READ WRITE CONTROL INSTRUCTION |
|---|---|---|---|---|
| #0 | NEXT | XB<0 | TP<0 | |
| #1 | REPEAT4 | XB<XB+1 | | W |
| #2 | A: NEXT | | | R |
| #3 | JNI A 2 | XB<XB+1 | | /D W |
| #4 | NEXT | | | R |
| #5 | JNI A 1 | XB<XB+1 | TP</TP | /D W |
| #6 | STOP | | | |

*FIG.3*

| CACHE MEMORY ADDRESS | COMPRESSED INSTRUCTION 21 | ADDRESS SIGNAL 102 | ADDRESS CONTROL MEMORY 32a | XB REGISTER | DATA CONTROL MEMORY 32b | TP REGISTER | READ WRITE CONTROL MEMORY 32c | ADDRESS PATTERN SIGNAL | DATA PATTERN SIGNAL | READ WRITE PATTERN SIGNAL |
|---|---|---|---|---|---|---|---|---|---|---|
| #0 | REPEAT4#1 | #0 | XB<0 | INVALID | TP<0 | INVALID | | INVALID | INVALID | |
| #0 | | #1 | XB<XB+1 | #0 | TP<TP | #0 | W | #0 | #0 | W |
| #0 | | #1 | XB<XB+1 | #1 | TP<TP | #0 | W | #1 | #0 | W |
| #0 | | #1 | XB<XB+1 | #2 | TP<TP | #0 | W | #2 | #0 | W |
| #0 | | #1 | XB<XB+1 | #3 | TP<TP | #0 | W | #3 | #0 | W |
| #1 | JNI2#3#2 | #2 | XB<XB | #0 | TP<TP | #0 | R | #0 | #0 | R |
| #1 | | #3 | XB<XB+1 | #0 | TP<TP | #0 | /D W | #0 | #FF | W |
| #1 | | #2 | XB<XB | #1 | TP<TP | #0 | R | #1 | #0 | R |
| #1 | | #3 | XB<XB+1 | #1 | TP<TP | #0 | /D W | #1 | #FF | W |
| #1 | | #2 | XB<XB | #2 | TP<TP | #0 | R | #2 | #0 | R |
| #1 | | #3 | XB<XB+1 | #2 | TP<TP | #0 | /D W | #2 | #FF | W |
| #1 | | #4 | XB<XB | #3 | TP<TP | #0 | R | #3 | #0 | R |
| #1 | | #5 | XB<XB+1 | #3 | TP</TP | #0 | /D W | #3 | #FF | W |
| #2 | JMP#5#2 | #2 | XB<XB | #0 | TP<TP | #FF | R | #0 | #FF | R |
| #2 | | #3 | XB<XB+1 | #0 | TP<TP | #FF | /D W | #0 | #0 | W |
| #3 | JNI2#3#2 | #2 | XB<XB | #1 | TP<TP | #FF | R | #1 | #FF | R |
| #3 | | #3 | XB<XB+1 | #1 | TP<TP | #FF | /D W | #1 | #0 | W |
| #3 | | #2 | XB<XB | #2 | TP<TP | #FF | R | #2 | #FF | R |
| #3 | | #3 | XB<XB+1 | #2 | TP<TP | #FF | /D W | #2 | #0 | W |
| #4 | STOP#6 | #4 | XB<XB | #3 | TP<TP | #FF | R | #3 | #FF | R |
| #4 | | #5 | XB<XB+1 | #3 | TP</TP | #FF | /D W | #3 | #0 | W |
| #4 | | #6 | XB<XB | #0 | TP<TP | #0 | R | #0 | #0 | R |

FIG.6

```
NEXT        :XB<0
            :XB<XB+1
NEXT        :XB<XB+1
            :XB<XB+1
NEXT        :XB<XB+1
            :
A:JNI A #3  :XB<XB+1
            :
JNI A #1    :XB<XB+1
            :
STOP        :
            :
```

FIG.10

| COMPRESSED INSTRUCTION | ADDRESS SIGNAL 102 | JFLG 104 | PATTERN FORMER 26A ADDRESS CONTROL MEMORY | PATTERN FORMER 26A XB REGISTER | PATTERN FORMER 26B ADDRESS CONTROL MEMORY | PATTERN FORMER 26B XB REGISTER | ADDRESS PATTERN SIGNAL 106 |
|---|---|---|---|---|---|---|---|
| JNI#3#3#3 | 0 | 0 | | INVALID | XB<0 | 0 | INVALID<br>0 |
| | 1 | 0 | XB<0+1 | 1 | XB<XB+2 | 2 | 1<br>2 |
| | 2 | 0 | XB<XB+2 | 3 | XB<XB+2 | 0 | 3<br>0 |
| | 3 | 0 | XB<XB+1 | 0 | XB<XB+1 | 1 | 0<br>1 |
| | 3 | 1 | XB<XB+1 | 1 | XB<XB+1 | 2 | 1<br>2 |
| | 3 | 1 | XB<XB+1 | 2 | XB<XB+1 | 3 | 2<br>3 |
| | 3 | 0 | XB<XB+1 | 3 | XB<XB+1 | 0 | 3<br>0 |
| JMP #4#3 | 4 | 1 | XB<XB+1 | 0 | XB<XB+1 | 1 | 0<br>1 |
| JNI#3#3#3 | 3 | 0 | XB<XB+1 | 1 | XB<XB+1 | 2 | 1<br>2 |
| | 3 | 1 | XB<XB+1 | 2 | XB<XB+1 | 3 | 2<br>3 |
| | 3 | 1 | XB<XB+1 | 3 | XB<XB+1 | 0 | 3<br>0 |
| | 3 | 1 | XB<XB+1 | 0 | XB<XB+1 | 1 | 0<br>1 |
| STOP #5 | 4 | 0 | XB<XB+1 | 1 | XB<XB+1 | 2 | 1<br>2 |
| | 5 | 0 | XB<XB+1 | 2 | XB<XB | 2 | 2<br>2 |

FIG.11

| CYCLE | COMPRESSED INSTRUCTION A | COMPRESSED INSTRUCTION B | JFLG 104A | ADDRESS SIGNAL 102A | JFLG 104B | ADDRESS SIGNAL 102B |
|---|---|---|---|---|---|---|
| INITIALIZATION | INITIALIZE PATTERN FORMER | | INVALID | INVALID | 1 | #0 |
| 1 | REPEAT4 #1 | JIN2 #3 #2 | 0 | #0 | 1 | #1 |
| 2 | | | 1 | #1 | 1 | #1 |
| 3 | | | 0 | #1 | 0 | #2 |
| 4 | JMP #5 #2 | | 1 | #3 | 0 | #2 |
| 5 | | | 1 | #3 | 0 | #2 |
| 6 | | | 0 | #3 | 0 | #4 |
| 7 | | JNI2 #3 #2 | 1 | #5 | 0 | #2 |
| 8 | STOP #6 | | 1 | #3 | 0 | #2 |
| 9 | | | 1 | #3 | 0 | #2 |
| 10 | | | 0 | #3 | 0 | #4 |
| 11 | | | 0 | #3 | 0 | #6 |

| CYCLE | JFLG 104A | ADDRESS SIGNAL 102A | ADDRESS CONTROL MEMORY ~32a | XB REGISTER | DATA CONTROL MEMORY ~32b | TP REGISTER | READ WRITE CONTROL MEMORY ~32c | ADDRESS PATTERN SIGNAL 106A | DATA PATTERN SIGNAL 108A | READ WRITE PATTERN SIGNAL 110A |
|---|---|---|---|---|---|---|---|---|---|---|
| INITIALIZATION | INVALID | INVALID | INVALID | INVALID | INVALID | INVALID | | INVALID | INVALID | |
| 1 | 0 | #0 | XB⇐0+1 | INVALID | TP⇐0 | INVALID | | INVALID | INVALID | |
| 2 | 1 | #1 | XB⇐XB+2 | #1 | TP⇐TP | #0 | W | #1 | #0 | W |
| 3 | 0 | #1 | XB⇐XB+1 | #3 | TP⇐TP | #0 | W | #3 | #0 | W |
| 4 | 1 | #3 | XB⇐XB+1 | #0 | TP⇐TP | #0 | /D W | #0 | #FF | W |
| 5 | 1 | #3 | XB⇐XB+1 | #1 | TP⇐TP | #0 | /D W | #1 | #FF | W |
| 6 | 0 | #3 | XB⇐XB+1 | #2 | TP⇐TP | #0 | /D W | #2 | #FF | W |
| 7 | 1 | #5 | XB⇐XB+1 | #3 | TP⇐/TP | #0 | /D W | #3 | #FF | W |
| 8 | 1 | #3 | XB⇐XB+1 | #0 | TP⇐TP | #FF | /D W | #0 | #0 | W |
| 9 | 1 | #3 | XB⇐XB+1 | #1 | TP⇐TP | #FF | /D W | #1 | #0 | W |
| 10 | 0 | #3 | XB⇐XB+1 | #2 | TP⇐TP | #FF | /D W | #2 | #0 | W |
| 11 | 0 | #5 | XB⇐XB+1 | #3 | TP⇐/TP | #FF | /D W | #3 | #0 | W |

FIG. 18

| CYCLE | JFLG 104B | ADDRESS SIGNAL 102B | ADDRESS CONTROL MEMORY 32a | XB REGISTER | DATA CONTROL MEMORY 32b | TP REGISTER | READ WRITE CONTROL MEMORY 32C | ADDRESS PATTERN SIGNAL 106B | DATA PATTERN SIGNAL 108B | READ WRITE PATTERN SIGNAL 110B |
|---|---|---|---|---|---|---|---|---|---|---|
| INITIALIZATION | 1 | #0 | XB<0 | INVALID | TP<0 | INVALID |  | INVALID | INVALID |  |
| 1 | 1 | #1 | XB<XB+2 | #0 | TP<TP | #0 | W | #0 | #0 | W |
| 2 | 1 | #1 | XB<XB+2 | #2 | TP<TP | #0 | R | #2 | #0 | W |
| 3 | 0 | #2 | XB<XB+1 | #0 | TP<TP | #0 | R | #0 | #0 | R |
| 4 | 0 | #2 | XB<XB+1 | #1 | TP<TP | #0 | R | #1 | #0 | R |
| 5 | 0 | #2 | XB<XB+1 | #2 | TP<TP | #0 | R | #2 | #0 | R |
| 6 | 0 | #4 | XB<XB+1 | #3 | TP</TP | #0 | R | #3 | #0 | R |
| 7 | 0 | #2 | XB<XB+1 | #0 | TP<TP | #FF | R | #0 | #FF | R |
| 8 | 0 | #2 | XB<XB+1 | #1 | TP<TP | #FF | R | #1 | #FF | R |
| 9 | 1 | #2 | XB<XB+1 | #2 | TP</TP | #FF | R | #2 | #FF | R |
| 10 | 0 | #4 | XB<XB+1 | #3 | TP<TP | #FF | R | #3 | #FF | R |
| 11 | 0 | #6 | XB<XB | #0 | TP<TP | #0 |  | #0 | #0 |  |

FIG.19

| CYCLE | ADDRESS PATTERN SIGNAL | DATA PATTERN SIGNAL | MEMORY CONTROL PATTERN SIGNAL |
|---|---|---|---|
| 1 | INVALID | INVALID | |
| | #0 | #0 | W |
| 2 | #1 | #0 | W |
| | #2 | #0 | W |
| 3 | #3 | #0 | W |
| | #0 | #0 | R |
| 4 | #0 | #FF | W |
| | #1 | #0 | R |
| 5 | #1 | #FF | W |
| | #2 | #0 | R |
| 6 | #2 | #FF | W |
| | #3 | #0 | R |
| 7 | #3 | #FF | W |
| | #0 | #FF | R |
| 8 | #0 | #0 | W |
| | #1 | #FF | R |
| 9 | #1 | #0 | W |
| | #2 | #FF | R |
| 10 | #2 | #0 | W |
| | #3 | #FF | R |
| 11 | #3 | #0 | W |
| | #0 | #0 | |

FIG.20

TEST PATTERN GENERATOR, A MEMORY TESTING DEVICE, AND A METHOD OF GENERATING A PLURALITY OF TEST PATTERNS

This patent application claims priority based on a Japanese patent application, H10-295157 filed on Oct. 16, 1998, the contents of which are incorporated herein by reference.

BACKGROUND OF THE INVENTION

1. Field of the Invention

The present invention relates to a semiconductor memory testing device, and more particularly to a memory testing device, a high speed test pattern generator, and a method of generating a plurality of high speed test patterns.

2. Description of the Related Art

The conventional semiconductor memory testing device is shown in FIG. 1. The conventional semiconductor memory testing device comprises a sequence controller 62 and a pattern former 26. The sequence controller 62 controls the generating order of the test patterns for testing a semiconductor memory device. The sequence controller 62 generates an address signal 102 to be output to the pattern generator 26. The pattern generator 26 generates an address pattern signal 106, a data pattern signal 108, and a read write pattern signal 110. The address pattern 106 is input to address input pins of the memory device. The data pattern signal 108 is a data to be written on the memory device. The read and write pattern signal 110 assigns either a write cycle in which the data of the data pattern signal 108 is written on the memory device, or a read cycle in which the data written on the memory device is read out and compared with an expected signal, which is same as the data pattern signal 108.

The sequence controller 62 comprises a vector memory for storing vector instructions which indicate the generating order of the test patterns, a read out controller 14 for reading out the vector instructions from the vector memory 12, a vector cache memory including bank memories 16A and 16C, a pattern multiplexer for selecting either of the bank memories 16A and 16C to output the instructions, and an address expander 22 for generating the address signal 102 based on the instructions input from the pattern multiplexer 20. When the vector instructions read out from the vector memory 12 are being stored into one of the bank memories 16A and 16C, the vector instructions stored in the other of the bank memories 16A and 16C are read out and input to the address expander 22 via the pattern multiplexer 20.

The pattern former 26 comprises a control memory 32 for storing a pattern program to generate each of the test patterns, and a test pattern calculator 36 for generating the test patterns based on the pattern program stored in the control memory 32. The control memory 32 comprises an address control memory 32a, a data control memory 32b and a read and write control memory 32c. The test pattern calculator 36 comprises an XB register for generating an address pattern signal 106, a TP register for generating a data pattern signal 108, a multiplexer, and an XOR circuit. The address signal 102 generated by the sequence controller 62 is input to the address control memory 32a, the data control memory 32b, and the read and write control memory 32c.

The test pattern calculator 36 generates the address pattern signal 106, the data pattern signal 108, and a read and write signal 110 based on the address signal 102 and the pattern signal stored in the control memory 32c. The pattern signal 106 is calculated based on the instructions read out from the address control memory 32a. The data pattern signal 108 is calculated based on the instructions read out from the data control memory 32b and the read and write control memory 32c. The instructions read out from the read and write control memory 32c are directly output as the read and write pattern signal 110.

FIG. 2 shows instructions stored in the address control memory 32a, the data control memory 32b, and the read and write control memory 32c of the control memory 32. The instruction shown as "XB<0" indicates that the value of the XB register will be zero in the next cycle. The instruction shown as "XB<XB+1" indicates that the value of the XB register increases by 1 in the next cycle. The instruction shown as "XB<XB" indicates that the value of the XB register does not change in the next cycle. The instruction shown as "TP<0" indicates that the value of the TP register will be zero in the next cycle. The instruction shown as "TP<TP" indicates that the value of the TP register does not change in the next cycle. The instruction shown as "TP</TP" indicates that the value of the TP register is inverted in the next cycle. The instruction shown as "R" indicates that the read pattern signal is generated in the current cycle, and the instruction shown as "W" indicates that the write pattern signal is generated in the current cycle. The instruction shown as "/D" indicates that the pattern signal is inverted for output in the current cycle.

For example, when the value of the address signal 102 input to the pattern former 26 is #0, the instruction read out from the address control memory 32a to the test pattern calculator 36 is "XB<0", and the instruction read out from the data control memory 32b to the test pattern calculator 36 is "TP<0". When the value of the address signal 102 input to the pattern former 26 is #1, the instruction read out from the address control memory 32a to the test pattern calculator 36 is "XB<XB+1". In this case the instruction read out from the data control memory 32b to the test pattern calculator 36 is "TP<TP" and the instruction read out from the read and write control memory 32c to the test pattern calculator 36 is "W". The test pattern calculator 36 generates the address pattern signal 106, the data pattern signal 108, and the read and write pattern signal 110 based on the instructions input.

FIG. 3 shows an example of the sequence control instruction stored in the address expander used for generating the address signal 102. The instruction "NEXT" of the address #0 indicates that the instruction of the next address, the address #1 in this case, should be output. The instruction "REPEAT" indicates that the instruction of the current address should be repeatedly output "n" times, and following this the instruction of the next address should be output. The instruction "JNI A n" indicates that the instruction of the address marked with a label "A" should be output "n" times, and then the data of the next address should be output. In the example shown in FIG. 3, the address #3 includes the instruction "JNI A 2", and the address #2 is marked with a label "A". The data from the address #2 is output twice at the address #3, and then the data. from the address #4 is output. The instruction "STOP" indicates that the test should be terminated. The address expander generates the address signal 102 in accordance with these sequence control instructions to be output to the pattern former 26.

FIG. 4 shows compressed instructions stored in the vector memory 12. The sequence control instructions are extremely large in practical usage, so high speed memory with a large capacity. is required to store all of the sequence control instructions. Therefore, the sequence control instructions shown in FIG. 3 are compressed for storage in the vector memory 12 in order to save the capacity of the memory. The compressed instructions shown in FIG. 4 are the same as the sequence control instructions shown in FIG. 3. The sequence control instruction "NEXT" shown in FIG. 3 is omitted and the remainder of the sequence control instructions are stored in the vector memory 12 with each address of the instruction written next to the respective instruction.

The compressed instruction "REPEAT 4 #1" stored in the vector memory address #0 of the vector memory 12 indicates that the sequence control instruction of the address #1 is "REPEAT 4". The compressed instruction "JNI 2 #3 #2" stored in the vector memory address #1 indicates that the sequence control instruction of the address #3 is "JNI 2", and the instruction of the address #2 should be output twice. The compressed instruction "JNI 1 #5 #2" stored in the vector memory address #2 indicates that the sequence control instruction of the address #5 is "JNI 1", and the instruction of the address #2 should be output. The compressed instruction "STOP #6" stored in the vector memory address #3 indicates that the sequence control instruction of the address #6 is "STOP".

FIG. 5 shows instructions transferred from the vector memory 12 to the bank memories 16A and 16C. The sequence control instructions may include a plurality of loops as shown in FIG. 4. Expanding the plurality of loops into successive instructions may delay the generation of the address signal 102. Therefore, the read out controller reads out the compressed instructions stored in the vector memory 12 and expands the read out compressed instructions to be transferred to the bank memories 16A and 16B. As is understood from FIGS. 4 and 5, the instruction of the outside loop "JNI 1 #5 #2" is converted to a simple instruction "JMP #5 #2" indicating that the address of the instruction to be output jumps to the address #2 at the address #5. The instruction of the inside loop "JNI 2 #5 #2" is converted to two separated instructions. When the instruction "JMP #5 #2" is input, the address expander 22 outputs the instruction of the address #2. Because the instruction of the address #2 is "NEXT", the instruction of the address #3 "JNI 2 #3 #2" is output as the address signal 102.

FIG. 6 shows the operation to generate the test patterns based on the compressed instructions shown in FIG. 4. The compressed instructions stored in the vector memory 12 are expanded and transferred to the bank memories 16A and 16C. The address expander 22 generates the address signal 102 in accordance with the instructions expanded in the bank memories 16A and 16C and outputs the address signal 102 to the pattern former 26. In this embodiment shown in FIG. 6, the maximum value of the XB register is #3. When the value of the XB register exceeds #3, the value becomes #0. The effective value of the TP register is #FF (F means 15 out of 16 numbers or 15/16). The value of the TP register inverts within the effective number.

Firstly, the address expander 22 accepts the compressed instruction "REPEAT 4 #1" of the cache memory address #0 input from the bank memory 16A. The address expander 22, then repeatedly outputs the data of the address #1 4 times. The next compressed instruction is "JNI 2 #3 #2", therefore the address expander 22 outputs the data of the address #2 and #3 in order. The address expander then repeatedly outputs the data from the address #2 and #3 twice in accordance with the compressed instruction "JNI 2 #3 #2" of the cache memory address #1 input from the bank memory 16A. The next compressed instruction is "JMP #5 #2", which means that the sequence control instructions of the address #4 is "NEXT". The address expander 22 then outputs the instruction of the address #4 and #5 in order. The address expander outputs the instruction of the memory address #2 in accordance with the compressed instruction "JMP #5 #2" of the cache memory address #2 input from the bank memory 16A. As the sequence control instruction of the address #2 is "NEXT", the address expander 22 outputs the instruction of the address #3 in order. The next compressed instruction is "JNI 2 #3 #2", so the address expander 22 outputs the sequence control instructions of the address #2 and #3 twice. The next compressed instruction is "STOP #6", which means that the sequence control instructions of the address #4 to the address #6 are "NEXT" and address expander 22 outputs the instruction of the address #4 to #6 in order. The test is then terminated.

The pattern former 26 accepts the address signal 102 from the sequence controller 62 and outputs the control instructions stored in each of the control memories 32a, 32b, and 32c.

In the first cycle, the value of the address signal 102 is #0, therefore the XB register receives the address control instruction "XB<0" stored in the address #0 of the address control memory 32. The value of the XB register is set at #0 in this case. In the next cycle, the value of the address signal 102 is #1, therefore the address control instruction "XB<XB+1" is read out from the address control memory 32a and the pattern former 26 adds 1 to the value of the XB register. This results in the value of the XB register becoming #0+1=#1. The address signal 102 having a value #1 is repeatedly output 3 times. The pattern former 26 adds 1 to the value of the XB register each time the address signal 102 having the value #1 is output. When the value of the XB register is #3 and the value 1 is added to the XB register, the value of the XB register becomes #0.

In the next cycle, the address signal 102 having the value #2 is output. Following this the address control instruction "XB<XB" is read out from the address control memory 32a. The pattern former 26 keeps the value of the XB register at #0 as this is in accordance with the address control instruction "XB<XB". In the next cycle, the address signal 102 having the value #3 is output. The address control instruction "XB<XB+1" is therefore read out from the address control memory 32a and the value of the XB register becomes #1. The address control instructions are read out from the address control memory 32a in accordance with the values of the address signal 102, in order. The test pattern calculator 36 generates the address pattern signals 106 in accordance with the address control instructions.

Similarly, the data control instructions are read out from the data control memory 32b and the value of the TP register is rewritten based on the data control instructions. When the address signal 102 whose data control instruction is "TP<0" is output, the data control instruction "TP<0" is read out from the data control memory 32b. The value of the TP register becomes #0. The result of this is the value of the data pattern signal 108 becomes #0. When the address signal 102 whose data control instruction is "TP<TP" is output, the data control instruction "TP<TP" is read out from the data control memory 32b. The value of the TP register is maintained as it is at this time. When the address signal whose data control instruction is "TP</TP" is output, the value of the TP register is inverted.

Similarly, when the address signal 102 is output, whose instruction stored in the read and write control memory is "W", the instruction "W" is read out from the read and write control memory 32c. The test pattern calculator 36 outputs a read and write pattern signal 110 having the write cycle. When, on the other hand, the address signal 102 is output, whose instruction stored in the read and write control memory is "R", the instruction "R" is read out from the read and write control memory 32c. The test pattern calculator 36 outputs a read and write pattern signal 110 having the read cycle. When the address signal 102 is output, whose instruction stored in the read and write control memory is "/D", the value of the TP register is inverted to be output as the data pattern signal 108. This means that the data pattern signal 108 becomes #FF when the value of the TP register is #0, and the data pattern signal 108 becomes #0 when the value of the TP register is #FF.

In FIG. 6 for example, the values of the address signal 102 from the second cycle to the fifth cycle are #1, therefore, the instruction "W" stored in the address #1 of the read and write control memory 32c is output 4 times. The W signal is output as the read and write pattern signal 110 at this time. In the sixth cycle, the value of the address signal 102 is #2, therefore the instruction "R" is read out from the read and write control memory 32c. The R signal is output as the read and write pattern signal 110. In the seventh cycle, the value of the address signal 102 is #3, therefore the read and write instruction "/D W" is read out from the read and write memory 32c. The W signal is output as the read and write pattern signal 110 and the value of the data pattern signal 108 is inverted from #0 to #FF.

FIG. 7 shows another conventional semiconductor memory testing device capable of outputting address patterns at a high speed. Recently developed memory devices are operated at an extremely high frequency, making it difficult to generate address patterns at a high enough speed to allow testing of these memory devices by a single pattern former. Therefore a semiconductor memory testing device comprising a plurality of pattern formers is used to test these memory devices. The conventional semiconductor memory testing device shown in FIG. 7 comprises a plurality of pattern formers 26A and 26B to test a memory device operated with a high frequency. The pattern signals output from the plurality of pattern formers are simultaneously applied to the memory device 76. The sequence controller 62 shown in FIG. 7 is the same as the sequence controller shown in FIG. 1. The pattern formers 26A and 26B are the same as the pattern former 26 shown in FIG. 1. Therefore, the explanation will be omitted. The elements the same as the elements shown in FIG. 1 have the same marks and the explanation is therefore omitted.

FIG. 8 shows the instructions to be stored in the address control memory 32a of the pattern former 26A. The address control memory 32a comprises a normal field and an extended field. The instructions to go to the next address are stored in the normal field. The instructions not to go to the next address but to jump to other addresses are stored in the extended field. The data control memory 32b and the read and write control memory 32c respectively comprise normal fields and extended fields. This leads to the fact that the capacity of each of the memories 32a, 32b and 32c is required to be twice that of each of the control memories 32a, 32b and 32c shown in FIG. 1.

The instructions have been previously stored in the control memories 32 of the pattern formers 26A and 26B so that the desired address pattern signal 106, the data pattern signal 108, and the read and write pattern signal 110 are alternately generated by the pattern formers 26A and 26B. In the normal field of the address control memory 32a is stored an address control instruction obtained by combining two successive address control sequence instructions. For example, when the first address control sequence instruction "XB<0" and the second address control sequence instruction "XB<XB+1" are combined, the value of the XB register becomes 1. Therefore, the instruction "XB<1" is stored in the normal field of the address control memory 32a.

The value of the XB register becomes 2 based on the next two address control instructions "XB<XB+1" and "XB<XB+1", therefore the instruction "XB<XB+2" is stored in the normal field of the address control memory 32a. Similarly, the instructions "XB<XB+1", "XB<XB+1", and "XB<XB+1" are stored in the normal field. Stored in the extended field of the address control memory 32a, are the address control instructions obtained by combining two address control instructions which are not executed in sequential order. For example, in FIG. 8, the seventh sequence instruction "XB<XB+1", should be executed after the eighth sequence instruction "XB<XB" is executed. When these two instructions are executed, the value of the XB register increases by 1. Therefore, the instruction "XB<XB+1" is stored in the address #3 of the extended field of the address control memory 32a. The seventh instruction "XB<XB+1" should be executed after the tenth instruction "XB<XB" is executed. When these two instructions are executed, the value of the XB register increases by 1. Therefore, the instruction "XB<XB+1" is stored in the address #4 of the extended field of the address control memory 32a.

FIG. 9 shows the data to be stored in the address control memory 32a of the pattern former 26B. The address control memory 32a of the pattern former 26B comprises a normal field and an extended field the same as the address control memory 32a of the pattern former 26A. The instructions to go to the next address are stored in the normal field. The instructions not to go to the next address but to jump to other addresses are stored in the extended field.

The combined address control instructions stored in the address control memory 32a of the pattern former 26A and the address control memory 32a of the pattern former 26B have different instructions. This means that the address control instructions stored in the address control memory 32a of the pattern former 26A should be obtained by combining the first and second address control instructions, and the third and fourth address control instructions of the address control sequence instruction. The address control instructions stored in the address control memory 32a of the pattern former 26B is same as the first address control instruction of the address control sequence instruction, obtained by combining the second and third address control instructions.

FIG. 10 shows a pattern program to be executed by the address expander 22 of the pattern generator shown in FIG. 7. One address signal 102 is generated by the pattern former 26A and the pattern former 26b, so the pattern program to be executed by the address expander becomes half. The pattern program should be set to obtain a desired pattern signal by taking the control instructions stored in the address control memories 32a and 32b of the pattern formers 26A and 26B. The pattern program is compressed for storage in the vector memory.

FIG. 11 shows an operational example of the pattern formers 26A and 26B shown in FIG. 7. The compressed instructions stored in the vector memory 12 are read out to the bank memories 16A and 16C in order and selected by the MUX 20 to be input to the address expander 22. The address expander 22 accepts the first compressed instruction "JNI #3 #3 #3". When the address storing the first compressed instruction is #3, this means that the instruction "NEXT" is stored in the address #0, #1 and #2. The address expander 22 increases the value of the address signal 102 from 0 to 3. The value of the address #3 is output 3 times in accordance with the instruction "JNI #3 #3 #3".

The value of the address signal varies by 0, 1, 2, 3, 3, 3, 3 as shown in FIG. 11. The address expander sets the value of the JFLG 104 as 1 when the value of the address is changed by the instruction "JUMP". Otherwise, the value of the JFLG 104 becomes 0. The pattern former 26A outputs the address control instruction in accordance with the value of the address signal 102. At this time, the value of the extended field of the address control memory 32*a* is read out when the value of the JFLG 104 is 1, and the value of the normal field of the address control memory 32*a* is read out when the value of the JFLG 104 is 0.

The test pattern calculator 36 of the pattern former 26A changes the value of the XB register based on the address control instruction read out from the address control memory 32*a* and outputs the changed value. The test pattern calculator 36 of the pattern former 26B reads out the address control instruction from the address memory 32*a* in accordance with the address signal 102 and outputs the value. The value of the XB register of the pattern former 26B changes in accordance with the address control instruction read out from the address control memory 32*a* of the pattern former 26B. The high speed converter 30, shown in FIG. 7, selects either of the pattern formers 26A or 26B to output the signal. The address pattern signal shown in FIG. 11 is thus obtained. The data pattern signal 108 and the read and write signal 110 are obtained similarly.

The semiconductor memory testing device shown in FIG. 7 is capable of outputting the address patterns at a high speed. However, the control memory 32 of the semiconductor memory testing device shown in FIG. 7 is required to have a large capacity because when the instruction is "REPEAT uneven numbers", an additional instruction "NEXT" is required to be written after the instruction "REPEAT uneven numbers". Furthermore, new control instructions obtained by combining two control instructions to be stored in each of the control memories 32, the sequence control instructions and the compressed instructions have to be designed to correspond to the new control instructions. The pattern program is so large that it was difficult to design the compressed instructions in consideration of the new control instructions.

SUMMARY OF THE INVENTION

Therefore, it is an object of the present invention to provide a test pattern generator, a memory testing device, and a method of generating a plurality of test patterns which overcomes the above issues in the related art. This object is achieved by combinations described in the independent claims. The dependent claims define further advantageous and exemplary combinations of the present invention.

In order to solve the above-stated problem, the present invention provides a test pattern generator for generating a plurality of test patterns to test a memory comprising: a control memory for storing a plural kinds of control instructions to generate the test patterns; a vector memory for storing vector instructions indicating an order of the control instructions to be read out from the control memory; a plurality of bank memories for storing the vector instructions read out from the vector memory, the bank memories alternatively storing the vector instructions; an address expander for generating an address of each of the control instructions in the control memory in accordance with the vector instructions stored in the plurality of bank memories; and a test pattern calculator for generating the test patterns based on the control instructions read out from an address generated by the address expander stored in the control memory.

Moreover, the present invention provides a test pattern generator for generating a plurality of test patterns to test a memory comprising: a control memory for storing a plural kinds of control instructions to generate the test patterns; a vector memory for storing vector instructions indicating an order of the control instructions to be read out from the control memory; a plurality of bank memories for storing the vector instructions read out from the vector memory; an address expander for generating an address of each of the control instructions in the control memory in accordance with the vector instructions stored in the plurality of bank memories; and a test pattern calculator for generating the test patterns based on the control instructions read out from an address generated by the address expander stored in the control memory.

Each of the vector instructions read out from the vector memory may be stored in each of the plurality of bank memories in order. The address expander may read out the vector instructions stored in the plurality of bank memories at the same time to generate an address of the control instructions in the control memory.

The test pattern calculator may comprise: sub test patterns based on the control instructions read out from the address of one of the sub control memories generated by the address expander, the sub test patterns being a part of the test patterns; and a high speed converter for generating the test patterns by outputting the sub test patterns from pattern calculators.

The control memory may comprise a plurality of sub control memories storing substantially same control instructions. The address expander may read out the vector instructions stored in the vector memory to generate an address of the control instructions in each of the plurality of sub control memories in order, for each of the plurality of sub control memories.

The control memory may comprise a plurality of sub control memories, each of the sub control memories storing a control instruction for generating a new test pattern based on an earlier test pattern generated at least two cycles ahead of the new test pattern. The address expander may read out the vector instructions stored in the vector memory to generate an address of the control instructions in each of the plurality of sub control memories in order, for each of the plurality of sub control memories.

Moreover, the present invention provides a test pattern generator for generating a plurality of test patterns to test a memory comprising: a plurality of control memories storing substantially same control instructions to generate the test patterns; a vector memory for storing vector instructions indicating an order of the control instructions to be read out from the plurality of sub control memories; an address expander for generating an address of each of the control instructions in each of the sub control memories for each of the sub control memories in accordance with the vector instructions stored in the vector memory; and a test pattern calculator for generating the test patterns based on the control instructions stored in the plurality of sub control memories indicated by the address generated by the address expander.

The plurality of sub control memories may store substantially same control instructions to generate a new test pattern based on an earlier test pattern generated at least two cycles ahead of the new test pattern.

The test pattern generator may further comprise a vector cache memory for storing the vector instructions read out from the vector memory, wherein the address expander generates an address of the control instructions in the plurality of sub control memories in accordance with the vector instructions stored in the vector cache memory.

The vector cache memory may comprise a plurality of bank memories for storing the vector instructions read out from the vector memory, each of the bank memories storing each of the vector instructions in order. The address expander may generate the address of the control instructions in the plurality of sub control memories in accordance with the vector instructions stored in the vector cache memory.

The vector cache memory may comprise a plurality of bank memories for storing the vector instructions read out from the vector memory. The address expander may generate the address of the control instructions in the plurality of sub control memories in accordance with the vector instructions stored in the vector cache memory.

The test pattern calculator may comprises: sub test patterns based on the control instructions read out from the address of one of the sub control memories generated by the address expander, the sub test patterns being a part of the test patterns; and a high speed converter for generating the test patterns by outputting the sub test patterns from pattern calculators.

Moreover, the present invention provides a test pattern generator for generating a plurality of test patterns to test a memory in a predetermined order comprising: a plurality of sub control memories each storing a control instruction for generating a new test pattern based on an earlier test pattern generated at least two cycles ahead of the new test pattern, a vector memory for storing vector instructions indicating an order of the control instructions to be read out from the plurality of sub control memories; an address expander for generating an address of each of the control instructions in each of the sub control memories for each of the sub control memories in accordance with the vector instructions stored in the vector memory; and a test pattern calculator for generating the test patterns based on the control instructions stored in the plurality of sub control memories indicated by the address generated by the address expander.

The plurality of sub control memories may store substantially same control instructions to generate a new test pattern based on an earlier test pattern generated at least two cycles ahead of the new test pattern.

The test pattern generator may further comprise a vector cache memory for storing the vector instructions read out from the vector memory, wherein the address expander generates an address of the control instructions in the plurality of sub control memories in accordance with the vector instructions stored in the vector cache memory.

The vector cache memory may comprise a plurality of bank memories for storing the vector instructions read out from the vector memory, each of the bank memories storing each of the vector instructions in order. The address expander may generate the address of the control instructions in the plurality of sub control memories in accordance with the vector instructions stored in the vector cache memory.

The vector cache memory may comprise a plurality of bank memories for storing the vector instructions read out from the vector memory. The address expander may generate the address of the control instructions in the plurality of sub control memories in accordance with the vector instructions stored in the vector cache memory.

The test pattern calculator may comprises: sub test patterns based on the control instructions read out from the address of one of the sub control memories generated by the address expander, the sub test patterns being a part of the test patterns; and a high speed converter for generating the test patterns by outputting the sub test patterns from pattern calculators.

Moreover, the present invention provides a memory testing device for testing electrical characteristic of a memory by comparing an output signal output from the memory when a predetermined signal is input to the memory with an expected signal output from a normal memory when the predetermined signal is input to the normal memory comprising: a control memory for storing a plural kinds of control instructions to generate a plurality of test patterns including the input signal and the expected signal; a vector memory for storing vector instructions indicating an order of the control instructions to be read out from the control memory; a plurality of bank memories for storing the vector instructions read out from the vector memory, each of the bank memories storing each of the vector instructions in order; an address expander for generating an address of each of the control instructions in the control memory in accordance with the vector instructions stored in the plurality of bank memories; a test pattern calculator for generating the test patterns based on the control instructions stored in the control memory indicated by the address generated by the address expander; a pin data selector for changing the test patterns generated by the test pattern calculator so as to correspond to pin arrangements of the memory; a waveform generator for generating the test patterns changed by the waveform generator; a memory acceptor comprising a memory slot to accept the memory, applying the test patterns generated by the waveform generator to the memory, and receiving the output signal output from the memory; and a comparing unit for judging whether or not the memory is normal by comparing the output signal received by the memory acceptor with the expected signal output from the pin data selector.

Moreover, the present invention provides a memory testing device for testing electrical characteristic of a memory by comparing an output signal output. from the memory when a predetermined signal is input to the memory with an expected signal output from a normal memory when the predetermined signal is input to the normal memory comprising: a control memory for storing a plural kinds of control instructions to generate a plurality of test patterns including the input signal and the expected signal; a vector memory for storing vector instructions indicating an order of the control instructions to be read out from the control memory; a plurality of bank memories for storing the vector instructions read out from the vector memory; an address expander for generating an address of each of the control instructions in the control memory in accordance with the vector instructions stored in the plurality of bank memories; a test pattern calculator for generating the test patterns based on the control instructions stored in the control memory indicated by the address generated by the address expander; and a memory acceptor applying the test patterns generated by the test pattern calculator to the memory, and receiving the output signal output from the memory.

Each of the vector instructions read out from the vector memory may be stored in each of the plurality of bank memories in order. The address expander may read out the vector instructions stored in the plurality of bank memories at the same time to generate an address of the control instructions in the control memory.

The test pattern calculator may comprise: sub test patterns based on the control instructions read out from the address of one of the sub control memories generated by the address expander, the sub test patterns being a part of the test patterns; and a high speed converter for generating the test patterns by outputting the sub test patterns from pattern calculators.

The control memory may comprise a plurality of sub control memories storing substantially same control instructions. The address expander may read out the vector instructions stored in the vector memory to generate an address of the control instructions in each of the plurality of sub control memories in order, for each of the plurality of sub control memories.

The control memory may comprise a plurality of sub control memories, each of the sub control memories storing a control instruction for generating a new test pattern based on an earlier test pattern generated at least two cycles ahead of the new test pattern. The address expander may read out the vector instructions stored in the vector memory to generate an address of the control instructions in each of the plurality of sub control memories in order, for each of the plurality of sub control memories.

Moreover, the present invention provides a memory testing device for testing electrical characteristics of a memory by comparing an output signal output from the memory when a predetermined signal is input to the memory with an expected signal output from a normal memory when the predetermined signal is input to the normal memory comprising: a plurality of sub control memories for storing a plural kinds of control instructions to generate a plurality of test patterns including the input signal and the expected signal, the plurality of sub control memories storing substantially same control instructions; a vector memory for storing vector instructions indicating an order of the control instructions to be read out from the plurality of control memories; an address expander for generating addresses of the control instructions in each of the plurality of sub control memories for each of the plurality of sub control memories in accordance with the vector instructions stored in the vector memory; a test pattern calculator for generating the test patterns based on the control instructions stored in the plurality of sub control memories indicated by the address generated by the address expander; and a memory acceptor applying the test patterns generated by the test pattern calculator to the memory, and receiving the output signal output from the memory.

Moreover, the present invention provides a memory testing device for testing electrical characteristics of a memory by comparing an output signal output from the memory when a predetermined signal is input to the memory with an expected signal output from a normal memory when the predetermined signal is input to the normal memory comprising: a control memory for storing a plural kinds of control instructions to generate a plurality of test patterns including the input signal and the expected signal; a plurality of sub control memories for storing a control instruction for generating a new test pattern based on an earlier test pattern generated at least 2 cycles ahead of the new control instruction; a vector memory for storing vector instructions indicating an order of the control instructions to be read out from the plurality of control memories; an address expander for generating addresses of the control instructions in each of the plurality of sub control memories for each of the plurality of sub control memories in accordance with the vector instructions stored in the vector memory; a test pattern calculator for generating the test patterns based on the control instructions stored in the plurality of sub control memories indicated by the address generated by the address expander; and a memory acceptor applying the test patterns generated by the test pattern calculator to the memory, and receiving the output signal output from the memory.

The plurality of sub control memories may store substantially same control instructions to generate a new test pattern based on an earlier test pattern generated at least two cycles ahead of the new test pattern.

The test pattern generator may further comprise a vector cache memory for storing the vector instructions read out from the vector memory, wherein the address expander generates an address of the control instructions in the plurality of sub control memories in accordance with the vector instructions stored in the vector cache memory.

The vector cache memory may comprise a plurality of bank memories for storing the vector instructions read out from the vector memory, each of the bank memories storing each of the vector instructions in order. The address expander may generate the address of the control instructions in the plurality of sub control memories in accordance with the vector instructions stored in the vector cache memory.

The vector cache memory may comprise a plurality of bank memories for storing the vector instructions read out from the vector memory. The address expander may generate the address of the control instructions in the plurality of sub control memories in accordance with the vector instructions stored in the vector cache memory.

The test pattern calculator may comprises: sub test patterns based on the control instructions read out from the address of one of the sub control memories generated by the address expander, the sub test patterns being a part of the test patterns; and a high speed converter for generating the test patterns by outputting the sub test patterns from pattern calculators.

Moreover, the present invention provides a method for generating a plurality of test patterns to test a memory, comprising: a first storing step of storing a plural kinds of control instructions to generate the test patterns into a control memory; a reading out step of reading out the control instructions from a vector memory storing vector instructions indicating an order of the control instructions to be read out from the control memory; a second storing step of storing the vector instructions read out from the vector memory into a plurality of bank memories, the vector instructions being alternately stored into the bank memories; an address generating step of generating an address of each of the control instructions in the control memory in accordance with the vector instructions stored in the plurality of bank memories; and a pattern generating step of generating the test patterns based on the control instructions, indicated by the address and stored in the control memory.

Moreover, the present invention provides a method for generating a plurality of test patterns to test a memory, comprising: a first storing step of storing a plural kinds of control instructions to generate the test patterns into a control memory; a reading out step of reading out the control instructions from a vector memory storing vector instructions, indicating an order of the control instructions to be read out from the control memory; a second storing step of storing the vector instructions read out from the vector memory into a plurality of bank memories; an address generating step of generating an address of each of the control instructions in the control memory in accordance with the vector instructions stored in the plurality of bank memories; and a pattern generating step of generating the test patterns based on the control instructions indicated by the address and stored in the control memory.

The second storing step may store each of the vector instructions read out from the vector memory into each of the plurality of bank memories in order. The address generating step may generate an address of the control instructions in the control memory in accordance with the vector instructions stored in the plurality of bank memories at the same time.

The test pattern step may comprise steps of: generating sub test patterns based on the control instructions read out from the address of one of the sub control memories generated by the address expander, the sub test patterns being a part of the test patterns; and generating the test patterns by outputting the sub test patterns.

The control memory may comprise a plurality of sub control memories storing substantially same control instructions. The address generating step may generate an address of the control instructions in each of the plurality of sub control memories in order for each of the plurality of sub control memories.

The control memory may comprise a plurality of sub control memories, each of the sub control memories storing a control instruction for generating a new test pattern based on an earlier test pattern generated at least two cycles ahead of the new test pattern. The address generating step may generate an address of the control instructions in each of the plurality of sub control memories in order for each of the plurality of sub control memories.

Moreover, the present invention provides a method for generating a plurality of test patterns to test a memory, comprising: a storing step of storing substantially same instructions into a plurality of sub control memories storing to generate the test patterns; a read out step of reading out vector instructions indicating an order of the control instructions to be read out from the plurality of sub control memories from the vector memory; an address generating step of generating an address of each of the control instructions in each of the sub control memories for each of the sub control memories in accordance with the vector instructions stored in the vector memory; and a test pattern generating step of generating the test patterns based on the control instructions stored in the plurality of sub control memories indicated by the address.

Moreover, the present invention provides a method for generating a plurality of test patterns to test a memory, comprising: a storing step of storing a control instruction for generating a new test pattern based on an earlier test pattern generated at least two cycles ahead of the new test pattern into a plurality of sub control memories; a reading out step of reading out vector instructions stored in a vector memory and indicating an order of the control instructions to be read out from the plurality of sub control memories; an address generating step of generating an address of each of the control instructions in each of the sub control memories for each of the sub control memories in accordance with the vector instructions stored in the vector memory; and a test pattern generating step of generating the test patterns based on the control instructions stored in the plurality of sub control memories indicated by the address.

The storing step may generate substantially same control instructions to generate a new test pattern based on an earlier test pattern generated at least two cycles ahead of the new test pattern into the plurality of sub control memories.

The read out step may store the vector instructions read out from the vector memory into a vector cache memory. The address generating step may generate an address of the control instructions in the plurality of sub control memories in accordance with the vector instructions stored in the vector cache memory.

The vector cache memory may comprise a plurality of bank memories for storing the vector instructions read out from the vector memory, each of the bank memories storing each of the vector instructions in order. The address generating step may generate an address of the control instructions in the plurality of sub control memories in accordance with the vector instructions stored in the vector cache memory.

The vector cache memory my comprise a plurality of bank memories for storing the vector instructions read out from the vector memory. The address generating step may generate an address of the control instructions in the plurality of sub control memories in accordance with the vector instructions stored in the vector cache memory.

The test pattern step may comprise steps of: generating sub test patterns based on the control instructions read out from the address of one of the sub control memories generated by the address expander, the sub test patterns being a part of the test patterns; and generating the test patterns by outputting the sub test patterns.

This summary of the invention does not necessarily describe all necessary features. The invention may also be a sub-combination of these described features.

BRIEF DESCRIPTION OF THE DRAWINGS

FIG. 2 shows an example of the instructions to be stored in the address control memory 32a, the data control memory 32b and the read and write control memory 32c;

FIG. 3 shows an example of the pattern program executed by the conventional pattern generator for a semiconductor memory testing device;

FIG. 6 shows the pattern signals generated by the address expander in accordance with the conventional pattern program;

FIG. 10 shows an example of the pattern program executed by the conventional pattern generator shown in FIG. 7;

FIG. 11 shows the compressed instructions of the pattern program shown in FIG. 10;

FIG. 18 shows the data stored in the sub control memory 32A and the test pattern calculator 38A;

FIG. 19 shows the data stored in the sub control memory 32A and the test pattern calculator 38A;

FIG. 20 shows the address pattern signal, the data pattern signal, and the read and write pattern signal output via the high speed converter.

DETAILED DESCRIPTION OF THE INVENTION

The invention will now be described based on the preferred embodiments. This does not intend to limit the scope of the present invention, but exemplify the invention. All of the features and the combinations thereof described in the embodiment are not necessarily essential to the invention.

Figure 12:
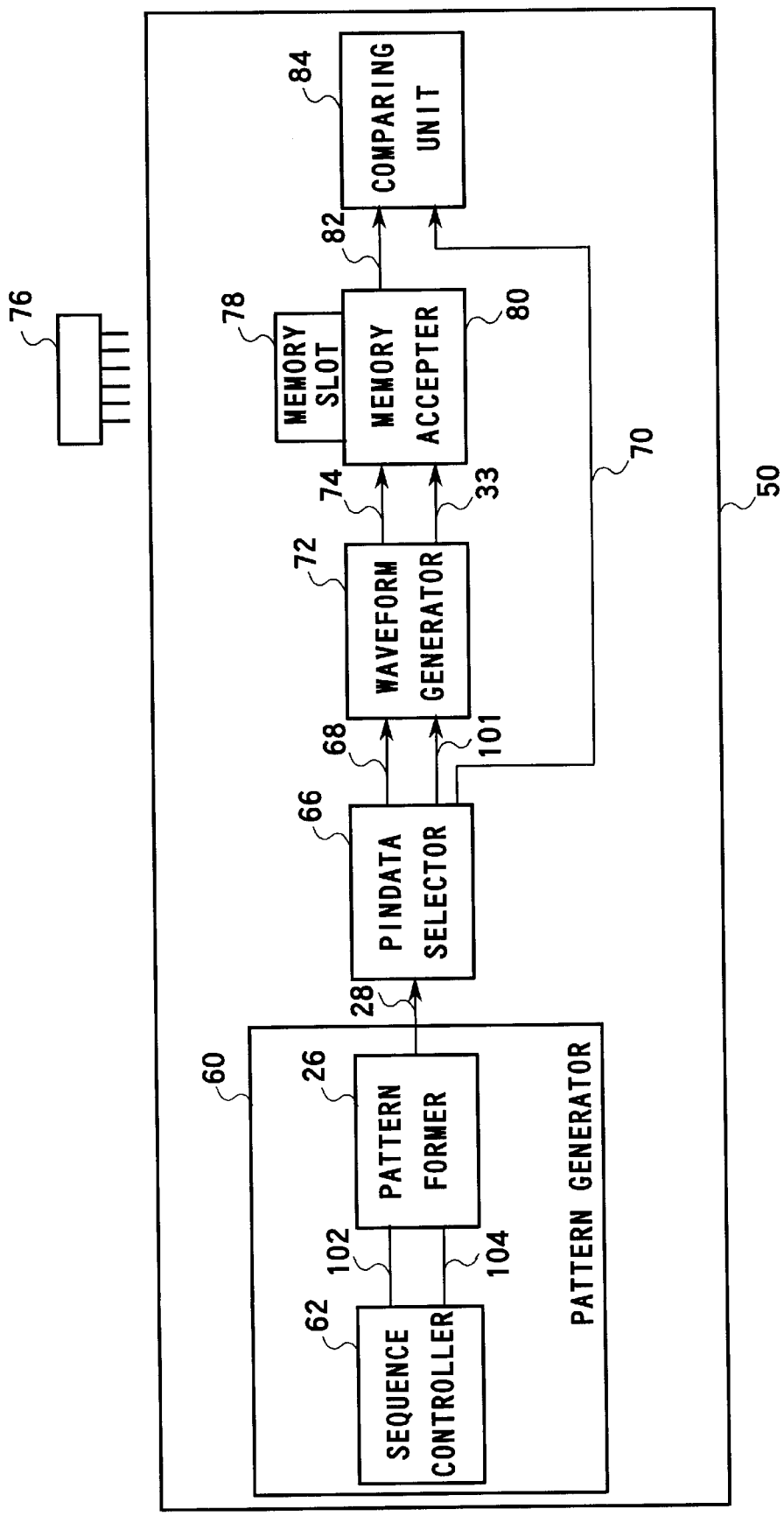
FIG. 12 is a diagram showing a semiconductor memory testing device according to the present invention.

FIG. 12 shows a preferred embodiment of the memory testing device 50 according to the present invention. The memory testing device 50 applies a predetermined input signal to a memory 76 to be tested. The memory testing device 50 then compares the output signal output from the memory 76 to be tested with the expected signal output from a normal memory when the same input signal is input to the normal memory. The memory testing device 50 judges whether or not the memory 76 to be tested is normal based on the results of the comparison. The memory testing device 50 comprises a pattern generator 60 for generating a test pattern, a pin data selector 66, a waveform generator 72, a memory slot 78 for accepting the memory 76, a memory acceptor 80 and a comparing unit 84. The pin data selector 66 adjusts the test pattern generated by the pattern generator to the pin arrangement of the memory 76. The waveform generator 72 generates the signal waveform of the test pattern adjusted by the pin data selector 66. The memory acceptor 80 applies the test pattern generated by the waveform generator 72 to the memory 76 and accepts the output signal output from the memory via the memory slot 76. The comparing unit 84 judges whether the or not the memory 76 is normal by comparing the output signal accepted by the memory acceptor and the expected value output from the pin data selector 66. The pattern generator 62 comprises a sequence controller 62 and a pattern former 26 for generating test patterns based on the address signals 102 and 104 generated by the sequence controller 62.

Figure 13:
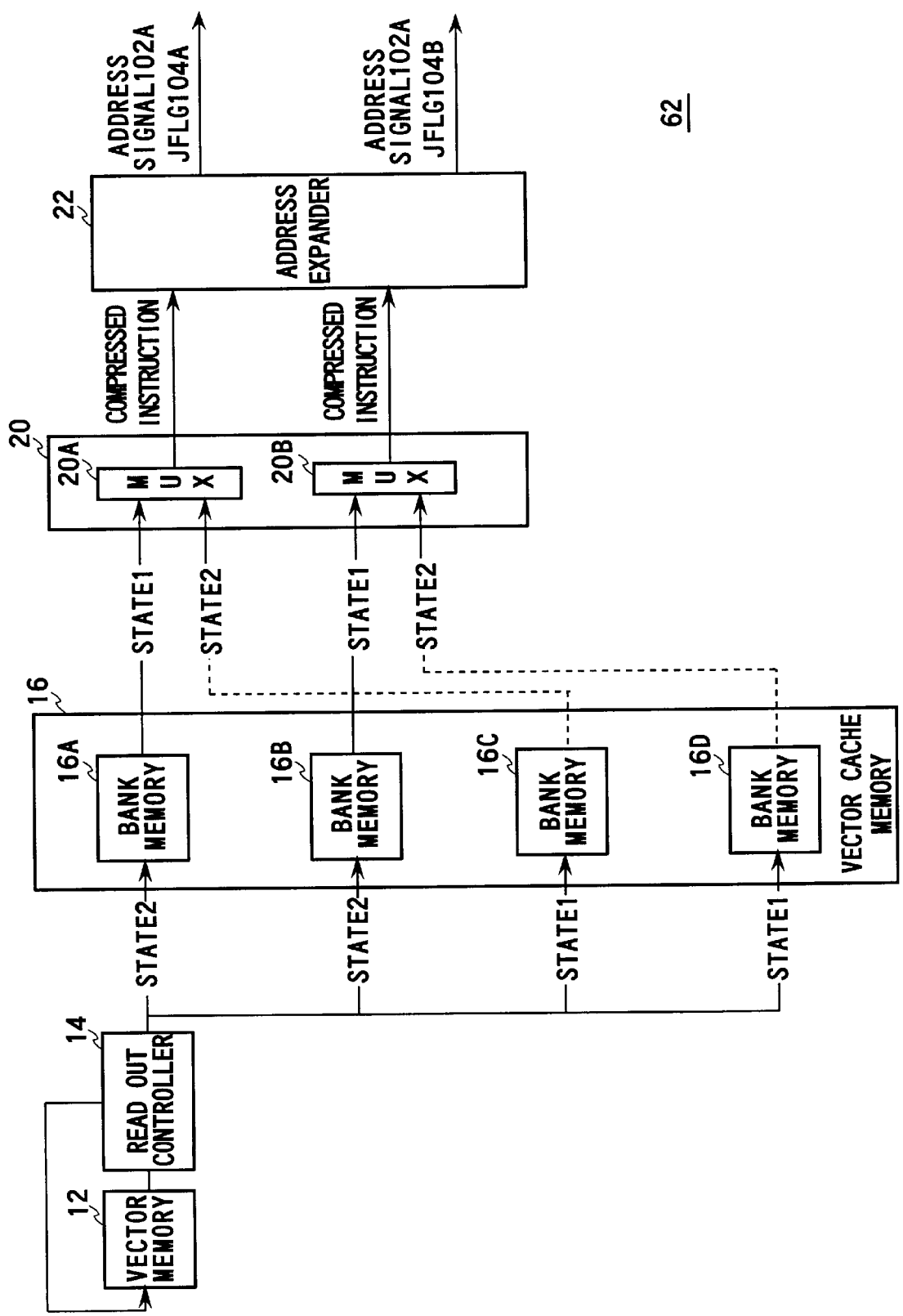
FIG. 13 is a diagram showing the sequence controller 62 of the pattern generator.

FIG. 13 shows the sequence controller 62 in detail. The sequence controller 62 comprises a vector memory 12 for storing compressed instructions, a read and write controller 14, a vector cache memory 16, a MUX (a pattern multiplexer) 20 and an address expander 22. The read and write controller 14 reads out the compressed instructions from the vector memory 12 and transfers the instructions to the vector cache memory 16 whilst expanding the plurality of loops. The vector cache memory 16 comprises a plurality of bank memories 16A, 16B, 16C and 16D. The MUX 20 comprises two MUX 20A and 20B and selects a compressed instruction to be input to the address expander 22. The MUX 20A selects either of the bank memories 16A or 16C to output the data of the address expander 22 to. The MUX 20B selects either of the bank memories 16B or 16D to output the data of the address expander 22 to.

The address expander 22 expands the compressed instruction "A" output from the MUX 20A and the compressed instruction "B" output from the MUX 20B to generate the address signal 102A, the JFLG 104A, the address signal 102B, and the JFLG 104B. While the MUX 20 is reading out the compressed instruction from two of the bank memories 16A, 16B, 16C and 16D, the read out controller 14 stores the compressed instruction read out from the vector memory 12 in the other two of the bank memories 16A, 16B, 16C and 16D. When all of the compressed instructions are stored in the first two bank memories, the MUX 20 starts reading out the compressed instruction from the other two bank memories. At the same time, the read out controller 14 stores the compressed instruction read out from the vector memory 12 in the first two bank memories. Thus, the address expander 22 can always read out the compressed instruction from the vector cache memory 16.

Figure 1:
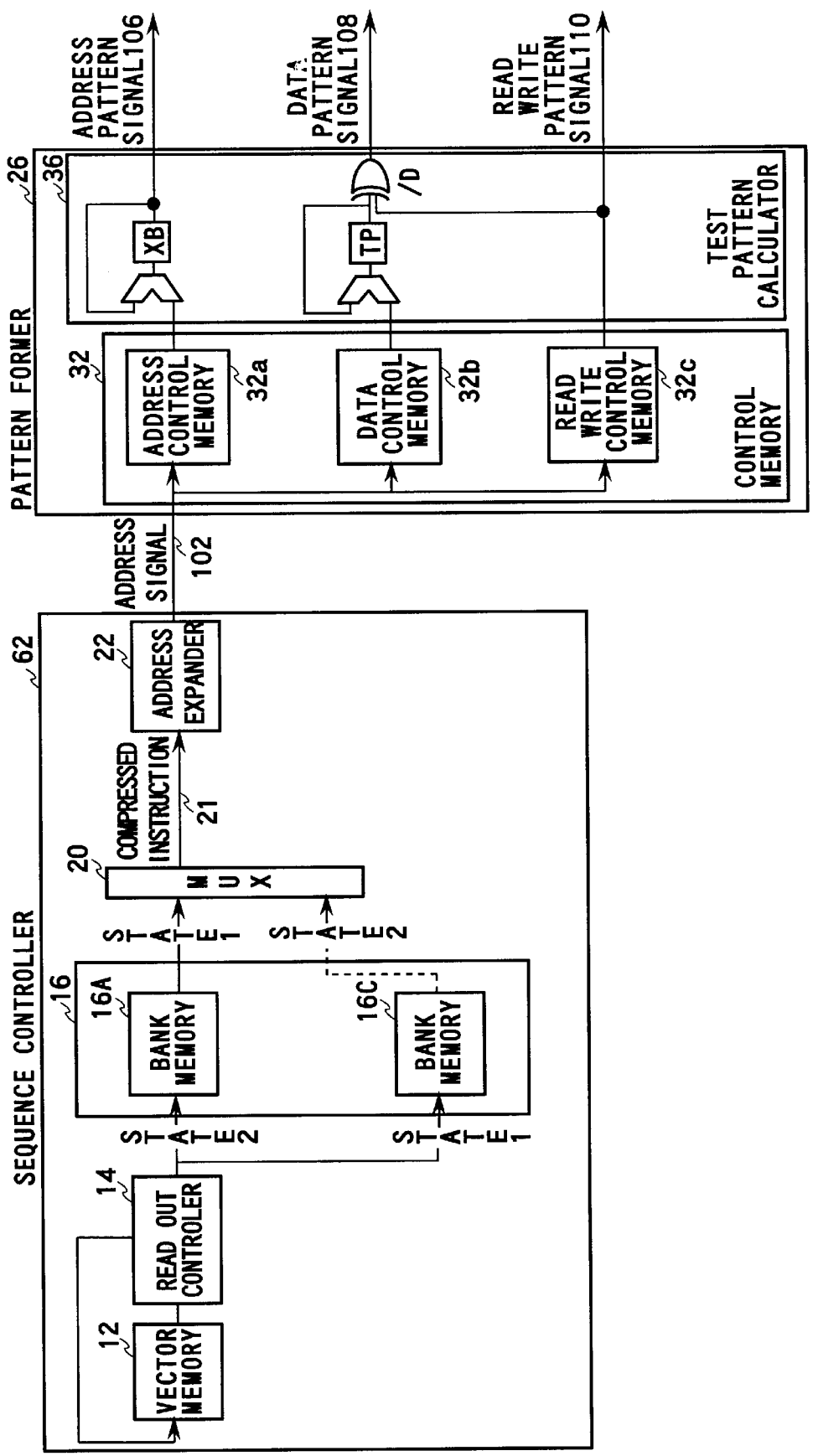
FIG. 1 is a diagram showing a conventional pattern generator for a semiconductor memory testing device.
Figure 4:
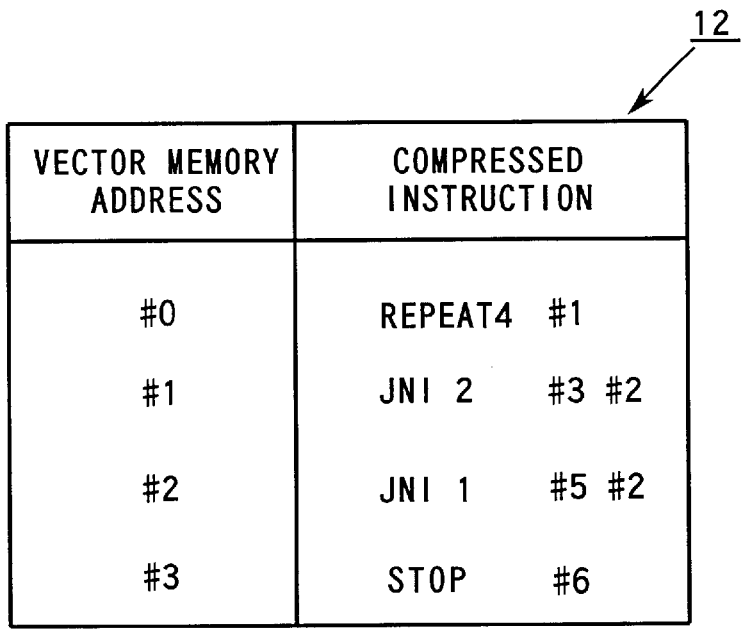
FIG. 4 shows the compressed instructions of the pattern program stored in the vector memory 12.
Figure 5:
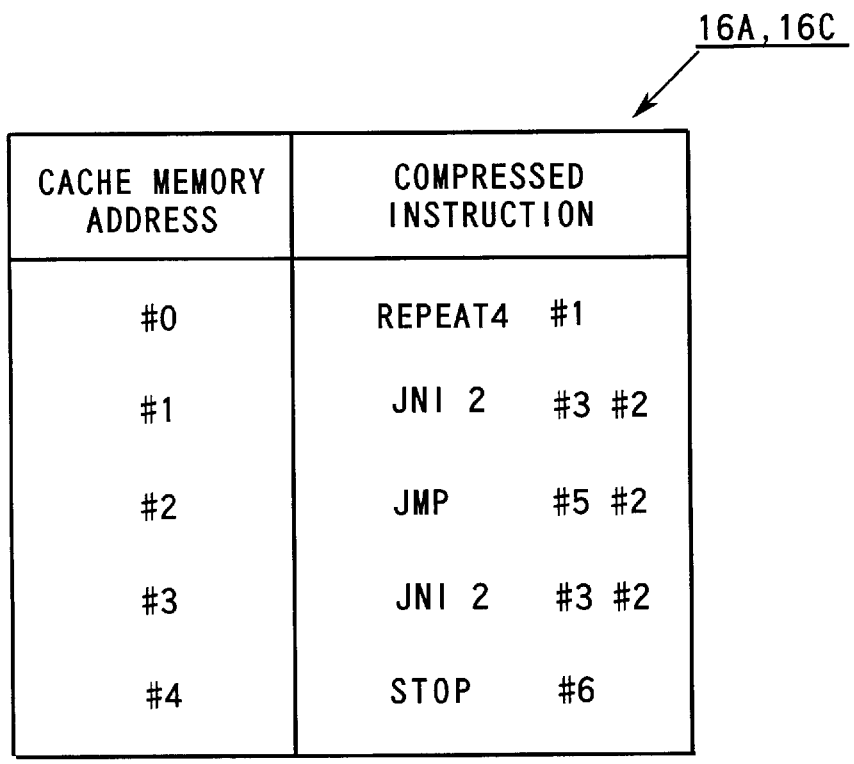
FIG. 5 shows the compressed instructions transferred from the vector memory 12 to the bank memory 16A.
Figure 14:
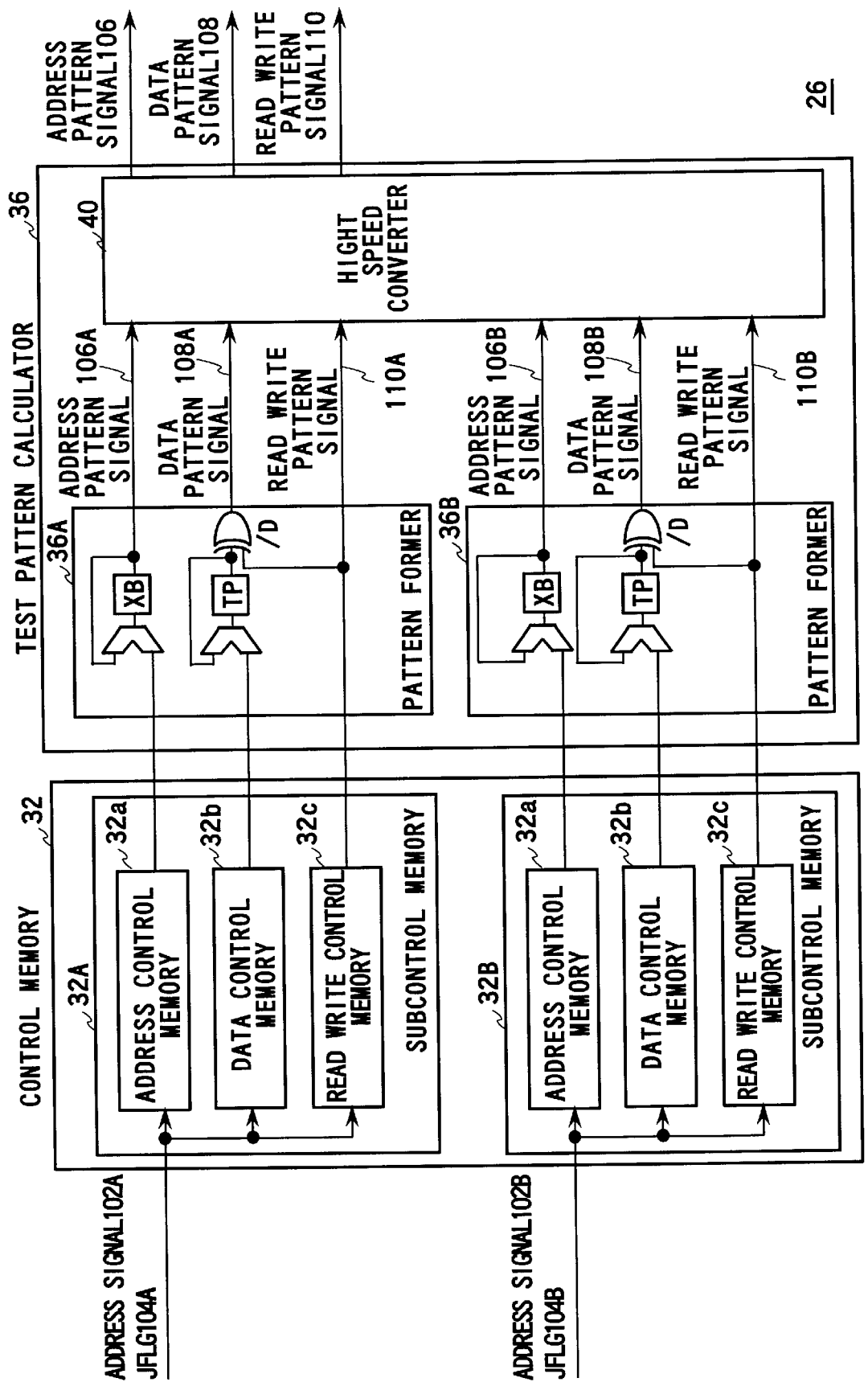
FIG. 14 is a diagram showing the pattern former 26 of the pattern generator.

FIG. 14 is a block diagram showing the pattern former in detail. The pattern former 26 comprises a control memory 32, and a test pattern calculator 36 for generating a pattern signal in accordance with the control instruction generated by the control memory 32. The address signal 102A, the JFLG 104A, the address signal 102B, and the JFLG 104B are input to the control memory 32. The control memory 32 comprises a plurality of sub control memories 32A and 32B. The structures of the sub control memories 32A and 32B are the same as that of the control memory 32 shown in FIG. 1, therefore the explanation is omitted here.

The test pattern calculator 36 comprises a plurality of pattern formers 36A and 36B, and a high speed converter 40. The pattern former 36A generates an address pattern signal 106A, a data pattern signal 108A and a read and write pattern signal 110A in accordance with the control instruction output from the sub control memory 32A. The pattern former 36B generates an address pattern signal 106B, a data pattern signal 108B and a read and write pattern signal 110B in accordance with the control instruction output from the sub control memory 32B. The high speed converter 40 selects either of the address pattern signals 106A or 106B, either of the data pattern signals 108A or 108B, and either of the read and write pattern signals 110A or 110B to output at a high speed.

Figure 15:
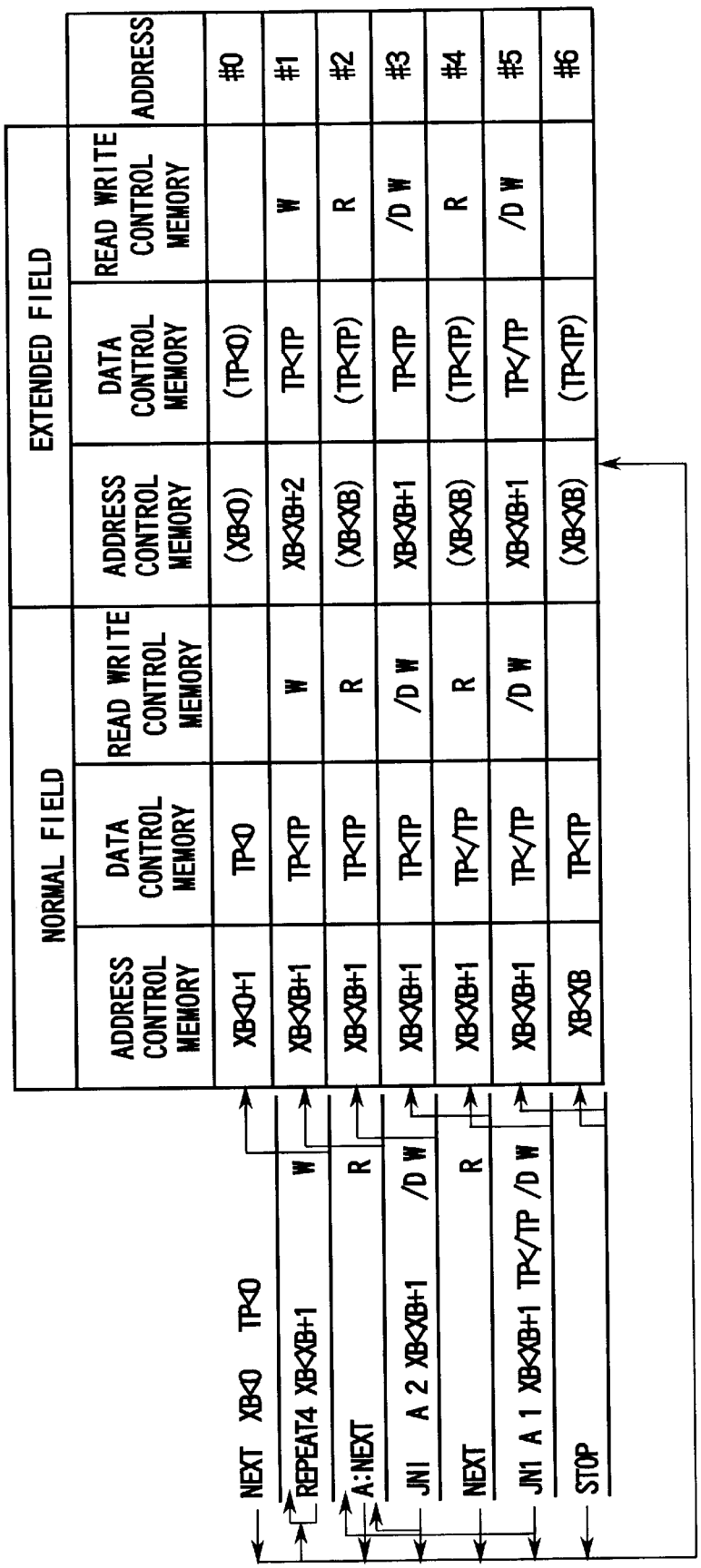
FIG. 15 shows the control instruction to be stored in each of the memories of the pattern former 26.

FIG. 15 shows the instructions to be stored in the sub control memories 32A and 32B. The same instructions are stored in each of the sub control memories 32A and 32B. Each of the sub control memories 32A and 32B comprises a normal field and an extended field. An example of the program to be executed by the address expander 22 is shown on the left side of FIG. 15. The pattern program shown in FIG. 15 is the same as the pattern program used in the conventional pattern generator.

When the first line instruction "NEXT" is executed, the value of the XB register becomes 0 because the address control memory of the first line instruction is "XB<0". When the second line instruction "REPEAT 4" is executed, the value of the XB register increases by increments of 1 because the address control memory of the first line instruction is "XB<XB+1". Therefore, the instruction "XB<0+1" obtained by combining the address control memories of the first line instruction and the second line instruction is stored in the address control memory 32a of the normal field of each of the sub control memories 32A and 32B. The instruction "XB<XB+1" obtained by combining the address control memories "XB<XB+1" and "XB<XB" of the second and third line instructions is stored in the next address #1 of the address control memory 32a.

Similarly the instruction obtained by combining the control instructions of the address pattern signal 106A generated when two successive instructions are executed is stored in the normal field. The control instructions of the data control signal 108A generated when two successive instructions are executed is stored in the data control memory 32b of the normal field of each of the sub control memories 32A and 32B. For example, in the data control memory 32b, the first line instruction is "TP<0" and the second line instruction is "TP<TP". When the first and second instructions of the pattern program are executed, the value 0 is stored in the register TP. Therefore, the instruction "TP<0" is stored in the first line of the data control memory 32 of the normal field. In the data control memory 32b, the second line instruction is "TP<TP" and the third line instruction is "TP<TP". Therefore, the value of the register TP does not change when these two instructions are executed and the instruction "TP<TP" is stored in the address #1 of the data control memory 32b.

Similarly, the instruction obtained by combining the control instructions generated when two successive instructions are executed is stored in the data control memory 32b and the read and write control memory 32c of the normal field.

The instruction obtained by combining the instructions which are not successive is stored in the extended field of each of the sub control memories 32A and 32B. For example, in the second line instruction of the pattern program shown in FIG. 15, the program repeats the second line instruction in accordance with the instruction "REPEAT 4". The address control memory of the second line instruction is "XB<XB+1" and when the second line instruction is repeated twice, the value of the XB register is doubled. Therefore, the instruction "XB<XB+2" is stored in the address control memory 32a of the extended field of each of the sub control memories 32A and 32B.

The fourth line instruction "JNI A 2" of the pattern program means that the program is to jump to the instruction labeled "A", which is the third line instruction. The address control memory of the fourth and third line instructions are "XB<XB+1" and "XB<XB" respectively, and the value of the XB register increases by 1 when these two instructions are executed. Therefore, the instruction "XB<XB+1" is stored in the fourth line of the address control memory of the extended field of each of the sub control memories 32A and 32B.

Similarly, in the remainder of the address control memory, the data control memory 32b and the read and write control memory 32c of the extended field, the instruction is obtained by combining two instructions when the program jumps to an instruction which is not successive to the first instruction. In the address #0 of the extended field of the sub control memories 32A and 32B, the instructions "XB<0" and "TP<0" to initialize the XB register and the TP register are stored.

Figure 7:
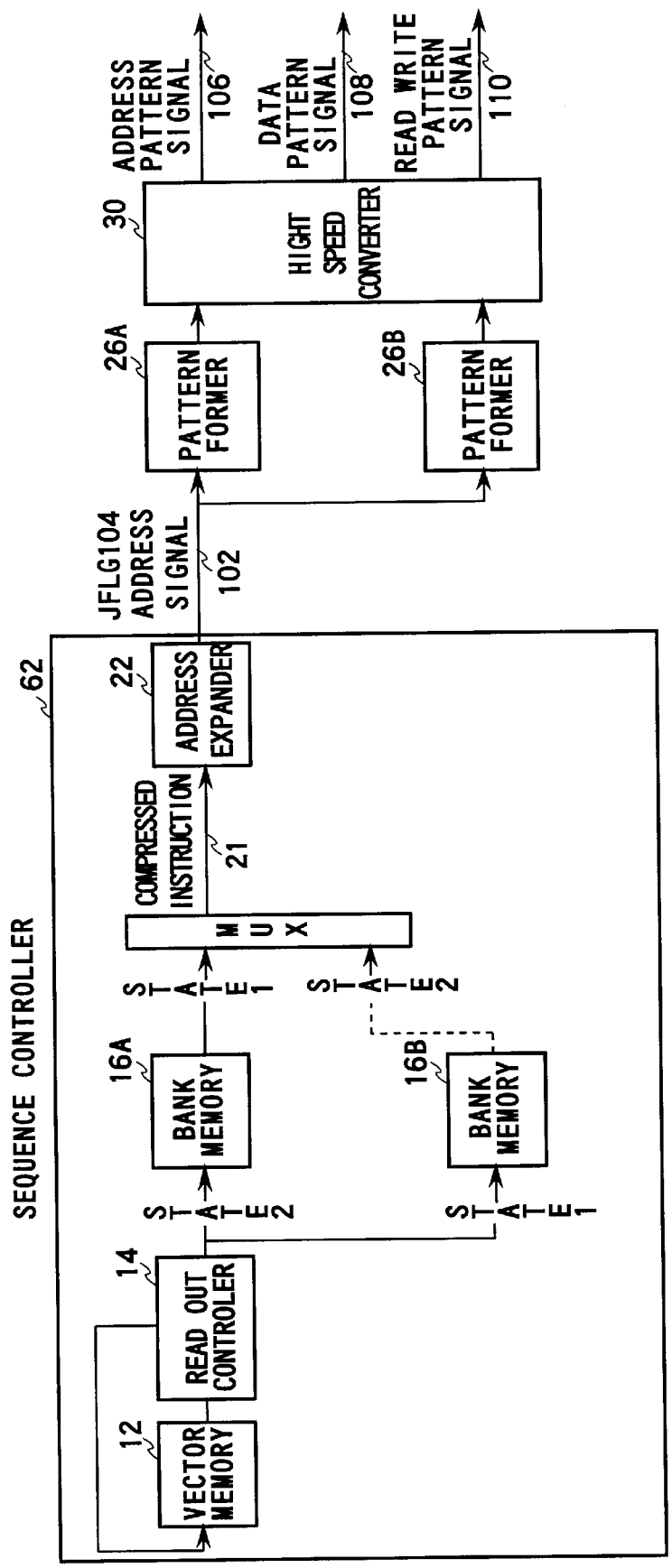
FIG. 7 is a diagram showing a conventional pattern generator capable of generating test patterns at a high speed, for a semiconductor memory testing device.
Figure 8:
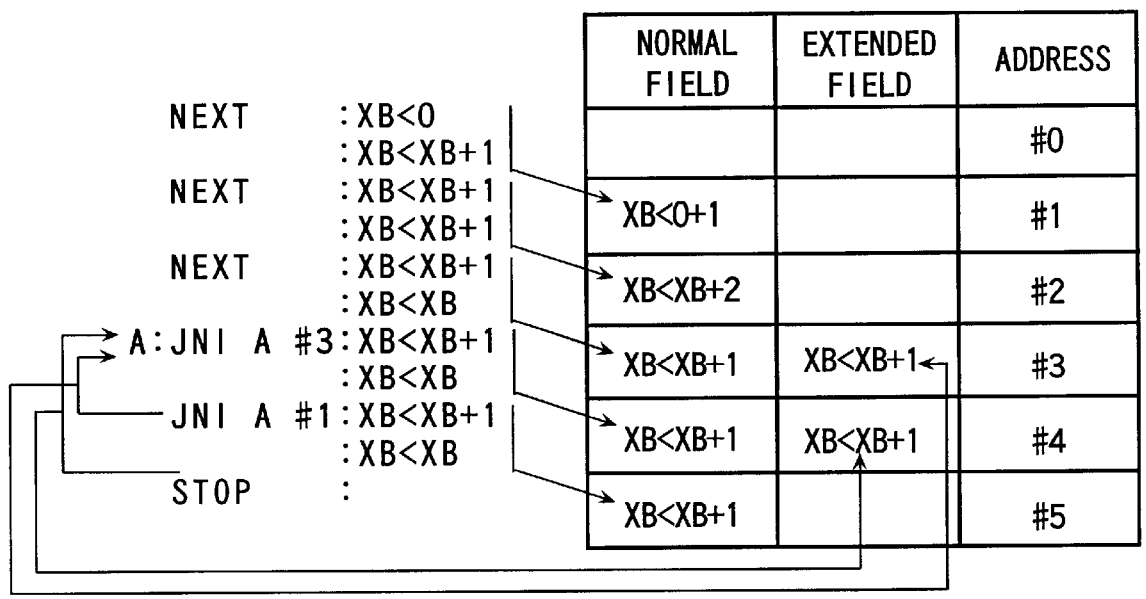
FIG. 8 shows the instructions to be stored in the first address control memory of the first pattern former of the pattern generator shown in FIG. 7.
Figure 9:
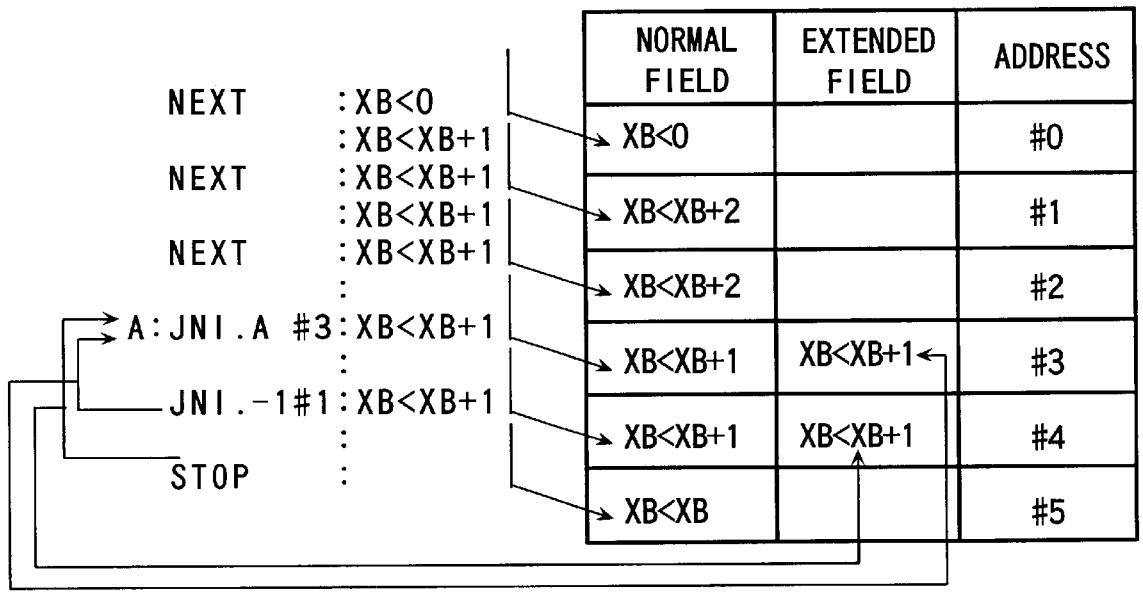
FIG. 9 shows the instructions to be stored in the second address control memory of the second pattern former of the pattern generator shown in FIG. 7.

In the semiconductor memory testing device shown in FIG. 7, the instructions obtained by combining two control instructions are stored in the address control memory 32a, the data control memory 32b and the read and write control memory 32c. Therefore, the control memory 32 of the semiconductor memory testing device shown in FIG. 7 is required to have a large capacity because when the instruction is "REPEAT uneven numbers", an additional instruction "NEXT" is required to be written after the instruction "REPEAT uneven numbers". However, in the semiconductor memory testing device shown in FIGS. 12 to 14, the instructions to be stored into the address control memory 32a, the data control memory 32b and the read and write control memory 32c are generated based on the plurality of pattern generating instructions of the address expander. Therefore, even when the instruction is "REPEAT uneven numbers", the control instructions corresponding to the instruction can be stored in the normal field and the extended field of each of the control memories 32. This especially effects to minimize required capacity of the control memory when test patterns having plurality of loop instructions are to be generated.

Figures 16, 17:
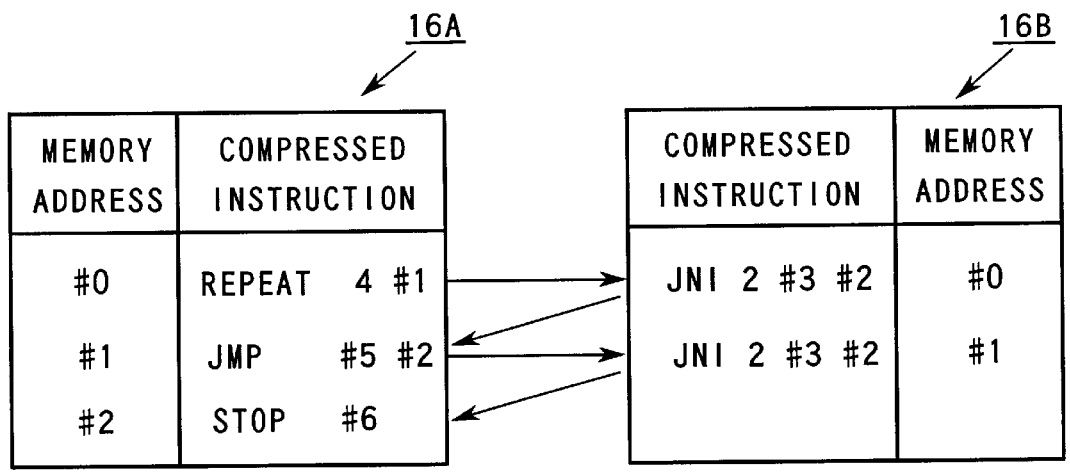
FIG. 16 shows the compressed instructions transferred from the vector memory 12 to the bank memories 16A and 16B.
FIG. 17 shows the values of the address signals generated in accordance with the compressed instructions shown in FIG. 16.

The compressed instructions are transferred from the vector memory 12 to the vector cache memory 16 as shown in FIG. 16. The first instruction "REPEAT 4 #1" is transferred to the address #0 of the bank memory 16. The second instruction "JNI 2 #3 #2" is transferred to the bank memory 16B. The compressed instructions except the loops are alternatively stored in the bank memories 16A and 16B.

The address signal 102A, the JFLG 104A, the address signal 102B, and the JFLG 104B are generated in accordance with the compressed instructions transferred to the bank memories 16A and 16B. In the first initialization cycle, the address expander 22 sets the JFLG 104B as 1 and the address signal 102 B as #0. When the initialization instruction is read out from the extended field of the sub control memory 32B, the values of the XB register and the register TP are initialized. The address expander 22 reads out the instructions "REPEAT 4" and "JNI 2 #3 #2" respectively from the bank memories 16A and 16B.

The first instruction "REPEAT 4 #1" indicates that the instruction "NEXT" is omitted before the instruction "REPEAT 4 #1" should be executed. Therefore, the value #0 as the address signal 102A and the value 0 as the JFLG 104A are output. The instruction "REPEAT 4 #1" is then executed. As the instruction "REPEAT 4 #1" is a jump instruction, the value #1 as the address signal 102B and the value 1 as the JFLG 104B are output. The jump instructions indicated by the instruction "REPEAT 4 #1" are executed four times and the signals generated by the jump instructions are alternatively output as the address signals 102A and 102B. When the fourth jump instruction is completed, the value #2 is output next, therefore the third cycle of the JFLG 104A becomes 0.

The second compressed instruction "JNI 2 #3 #2" indicates that this instruction is stored in the address #3. This means that the instruction "NEXT" is omitted in the address #2. The address expander 22 outputs the value #2 as the address signal 102B and the value 0 as the JFLG 104B. Then, the instruction "JNI 2 #3 #2" is executed. This instruction is a jump instruction, therefore the value 1 is output as the JFLG 104A and the value #3 is output as the address signal 102A. The value #2 as the address signal 102B and the value 0 as the JFLG 104B are output.

The compressed instructions are alternatively read out from the bank memories 16A and 16B, and the address signals are alternatively output as the address signals 102A and 102B. The value of the JFLG becomes 0 when the next address signal has a successive value, and becomes 1 when the next address signal has a jumped value. The value of the next address signal is determined by the value of the present address signal and the compressed instruction of the present address signal. This means that the value of the address signal 102A in the next cycle depends on the value of the address signal 102B and the compressed instruction of the present cycle. The value of the JFLG 104A is determined by the instruction output as the address signal 102A of the next cycle. This means that the value of the address signal 102B in the next cycle depends on the value of the address signal 102A and the compressed instruction of the present cycle. The value of the JFLG 104B is determined by the instruction output as the address signal 102B of the next cycle.

FIG. 18 shows the values output from the address control memory 32a, the data control memory 32b, and the read and write control memory 32c when the address control signal 102A and the JFLG 104A are output. FIG. 18 also shows the values of the address pattern signal 106A, the data pattern signal 108A, and the read and write pattern signal 110A. In the initialization cycle, the value of the address control signal is not determined, therefore invalid values are output from the address control memory 32a, the data control memory 32b and the read and write control memory 32c. The values of the XB register, the TP register, the address pattern signal 106A, the data pattern signal 108A, and the read and write pattern signal 110A are also invalid.

In the first cycle, the values of the address signal 102A and the JFLG 104A are zero. The instructions "XB<0+1" and "TP<0" are respectively read out from the address control memory 32a and the data control memory 32b. This leads to the value of the XB register being 1 and the value of the TP register being 0 in the second cycle. These values are output as the address pattern signal 106A and the data pattern signal 108A. In the second cycle, the instructions "XB<XB+2", "TP<TP" and "Write" are respectively read out from the address control memory 32a, the data control memory 32b and the read and write control memory 32c. The "Write" signal read out from the read and write control memory 32c is directly output as the read and write signal 110A. This leads to the value of the XB register being 3 and the value of the TP register being 0 in the third cycle.

In the third cycle, the instructions "XB<XB+1", "TP<TP" and "Write" are respectively read out from the address control memory 32a, the data control memory 32b and the read and write control memory 32c. This leads to the value of the XB register being 0 and the value of the TP register being maintained as 0 in the fourth cycle. Similarly, the instructions are read out from the address control memory 32a, the data control memory 32b and the read and write control memory 32c and input to the test pattern calculator 36. This generates the address pattern signal 106A, the data pattern signal 108A, and the read and write pattern signal 110A.

FIG. 19 shows the values output from the address control memory 32a, the data control memory 32b and the read and write control memory 32c when the address control signal 102B and the JFLG 104B are output. FIG. 19 also shows the values of the address pattern signal 106B, the data pattern signal 108B, and the read and write pattern signal 110B. In the initialization cycle, the value of the address control signal is zero and the value of the JFLG 104B is 1, therefore the instructions "XB<0" and "TP<0" are respectively output from the address control memory 32a and the data control memory 32b of the extended field. This leads to the initialized value of the XB register being 0 and the value of the initialized TP register also being 0 in the first cycle. In the first cycle, the values of the address signal 102B and the JFLG 104B are both 1. The instructions "XB<XB+2" and "TP<TP" are respectively read out from the address control memory 32a and the data control memory 32b of the extended field. This leads to the value of the XB register being 2 and the value of the TP register being maintained as 0 in the second cycle. The test pattern calculator 36B having the same operational functions as the pattern calculator 36A, outputs the address pattern signal 106B, the data pattern signal 108B and the read and write pattern signal 110B.

The high speed converter 20 selects either of the pattern signals output from the test pattern calculators 36A or 36B as the address pattern signal 106B, the data pattern signal 108B and the read and write pattern signal 110B as shown in FIG. 20. Thus, the high speed converter 40 can output the pattern signals at twice the speed of the conventional equivalent.

The pattern generator shown in FIG. 12 comprises two sub control memories to output the pattern control instructions at the same time, and two test pattern calculators 36A and 36B to output two pattern signals at the same time. The pattern former may comprise four sub control memories and four test pattern calculators. The high speed converter may select one of the four test pattern calculators to output the pattern signal in order. The difference between the pattern generator according to the present invention and the example shown in FIG. 7 is that the instructions of the former instruction is not combined with the present instruction. If the former instruction is combined with the present instruction, a variety of instructions are required when the instructions from several addresses jump to an instruction of an address. This leads to the fact that a number of instructions for the extended field and a number of values for the JFLG are required.

According to the present invention, the value of the JFLG is determined depending on whether the address signal of the next step has a successive value or a jumped value, and the combined instructions when the address signal of the next step has a jumped value are stored in the extended field, all of the combined instructions can be stored in the control memory 32 even when the instructions from several addresses jump to an instruction of an address. Furthermore, the combined instructions are generated based on a pattern program to be executed by the address expander, not by compressing a plurality of control instructions to be output from the control memory, the capacity of the control memory 32 required can be minified even a lot of loop instructions are included.

Although the present invention has been described by way of exemplary embodiments, it should be understood that many changes and substitutions may be made by those skilled in the art without departing from the spirit and the scope of the present invention which is defined only by the appended claims.

What is claimed is:

1. A test pattern generator for generating a plurality of test patterns to test a memory comprising:

a control memory for storing a plural kinds of control instructions to generate said test patterns;

a vector memory for storing vector instructions indicating an order of said control instructions to be read out from said control memory;

a plurality of bank memories for storing said vector instructions read out from said vector memory, said bank memories alternatively storing said vector instructions;

an address expander for generating an address of each of said control instructions in said control memory in accordance with said vector instructions stored in said plurality of bank memories; and a test pattern calculator for generating said test patterns based on said control instructions read out from an address generated by said address expander stored in said control memory.

2. A test pattern generator as set forth in claim 1, wherein each of said vector instructions read out from said vector memory are stored in each of said plurality of bank memories in order, and wherein said address expander reads out said vector instructions stored in said plurality of bank memories at the same time to generate an address of said control instructions in said control memory.

3. A test pattern generator as set forth in claim 1, wherein said control memory comprises a plurality of sub control memories storing substantially same control instructions, and wherein said address expander reads out said vector instructions stored in said vector memory to generate an address of said control instructions in each of said plurality of sub control memories in order, for each of said plurality of sub control memories.

4. A test pattern generator as set forth in claim 3, wherein said test pattern calculator comprises:
   sub test patterns based on said control instructions read out from said address of one of said sub control memories generated by said address expander, said sub test patterns being a part of said test patterns; and
   a high speed converter for generating said test patterns by outputting said sub test patterns from pattern calculators.

5. A test pattern generator as set forth in claim 1, wherein said control memory comprises a plurality of sub control memories, each of said sub control memories storing a control instruction for generating a new test pattern based on an earlier test pattern generated at least two cycles ahead of said new test pattern, and wherein said address expander reads out said vector instructions stored in said vector memory to generate an address of said control instructions in each of said plurality of sub control memories in order, for each of said plurality of sub control memories.

6. A test pattern generator for generating a plurality of test patterns to test a memory comprising:
   a control memory for storing a plural kinds of control instructions to generate said test patterns;
   a vector memory for storing vector instructions indicating an order of said control instructions to be read out from said control memory;
   a plurality of bank memories for storing said vector instructions read out from said vector memory;
   an address expander for generating an address of each of said control instructions in said control memory in accordance with said vector instructions stored in said plurality of bank memories; and
   a test pattern calculator for generating said test patterns based on said control instructions read out from an address generated by said address expander stored in said control memory.

7. A test pattern generator as set forth in claim 6, wherein each of said vector instructions read out from said vector memory are stored in each of said plurality of bank memories in order, and wherein said address expander reads out said vector instructions stored in said plurality of bank memories at the same time to generate an address of said control instructions in said control memory.

8. A test pattern generator as set forth in claim 6, wherein said control memory comprises a plurality of sub control memories storing substantially same control instructions, and wherein said address expander reads out said vector instructions stored in said vector memory to generate an address of said control instructions in each of said plurality of sub control memories in order, for each of said plurality of sub control memories.

9. A test pattern generator as set forth in claim 8, wherein said test pattern calculator comprises:
   sub test patterns based on said control instructions read out from said address of one of said sub control memories generated by said address expander, said sub test patterns being a part of said test patterns; and
   a high speed converter for generating said test patterns by outputting said sub test patterns from pattern calculators.

10. A test pattern generator as set forth in claim 6, wherein said control memory comprises a plurality of sub control memories, each of said sub control memories storing a control instruction for generating a new test pattern based on an earlier test pattern generated at least two cycles ahead of said new test pattern, and wherein said address expander reads out said vector instructions stored in said vector memory to generate an address of said control instructions in each of said plurality of sub control memories in order, for each of said plurality of sub control memories.

11. A test pattern generator for generating a plurality of test patterns to test a memory comprising:
    a plurality of sub control memories storing substantially same control instructions to generate said test patterns;
    a vector memory for storing vector instructions indicating an order of said control instructions to be read out from said plurality of sub control memories;
    an address expander for generating an address of each of said control instructions in each of said sub control memories for each of said sub control memories in accordance with said vector instructions stored in said vector memory; and
    a test pattern calculator for generating said test patterns based on said control instructions stored in said plurality of sub control memories indicated by said address generated by said address expander.

12. A test pattern generator as set forth in claim 11, wherein said plurality of sub control memories store substantially same control instructions to generate a new test pattern based on an earlier test pattern generated at least two cycles ahead of said new test pattern.

13. A test pattern generator as set forth in claim 11, further comprises a vector cache memory for storing said vector instructions read out from said vector memory, wherein said address expander generates an address of said control instructions in said plurality of sub control memories in accordance with said vector instructions stored in said vector cache memory.

14. A test pattern generator as set forth in claim 11, wherein said vector cache memory comprises a plurality of bank memories for storing said vector instructions read out from said vector memory, each of said bank memories storing each of said vector instructions in order, and wherein said address expander generates the address of said control instructions in said plurality of sub control memories in accordance with said vector instructions stored in said vector cache memory.

15. A test pattern generator as set forth in claim 11, wherein said vector cache memory comprises a plurality of bank memories for storing said vector instructions read out from said vector memory, and wherein said address expander generates the address of said control instructions in said plurality of sub control memories in accordance with said vector instructions stored in said vector cache memory.

16. A test pattern generator as set forth in claim 11, wherein said test pattern calculator comprises:
    sub test patterns based on said control instructions read out from said address of one of said sub control memories generated by said address expander, said sub test patterns being a part of said test patterns; and
    a high speed converter for generating said test patterns by outputting said sub test patterns from pattern calculators.

17. A test pattern generator for generating a plurality of test patterns to test a memory in a predetermined order comprising:

a plurality of sub control memories each storing a control instruction for generating a new test pattern based on an earlier test pattern generated at least two cycles ahead of said new test pattern, a vector memory for storing vector instructions indicating an order of said control instructions to be read out from said plurality of sub control memories;

an address expander for generating an address of each of said control instructions in each of said sub control memories for each of said sub control memories in accordance with said vector instructions stored in said vector memory; and a test pattern calculator for generating said test patterns based on said control instructions stored in said plurality of sub control memories indicated by said address generated by said address expander.

18. A test pattern generator as set forth in claim 17, wherein said plurality of sub control memories store substantially same control instructions to generate a new test pattern based on an earlier test pattern generated at least two cycles ahead of said new test pattern.

19. A test pattern generator as set forth in claim 17, further comprises a vector cache memory for storing said vector instructions read out from said vector memory, wherein said address expander generates an address of said control instructions in said plurality of sub control memories in accordance with said vector instructions stored in said vector cache memory.

20. A test pattern generator as set forth in claim 17, wherein said vector cache memory comprises a plurality of bank memories for storing said vector instructions read out from said vector memory, each of said bank memories storing each of said vector instructions in order, and wherein said address expander generates the address of said control instructions in said plurality of sub control memories in accordance with said vector instructions stored in said vector cache memory.

21. A test pattern generator as set forth in claim 17, wherein said vector cache memory comprises a plurality of bank memories for storing said vector instructions read out from said vector memory, and wherein said address expander generates the address of said control instructions in said plurality of sub control memories in accordance with said vector instructions stored in said vector cache memory.

22. A test pattern generator as set forth in claim 17, wherein said test pattern calculator comprises:

sub test patterns based on said control instructions read out from said address of one of said sub control memories generated by said address expander, said sub test patterns being a part of said test patterns; and a high speed converter for generating said test patterns by outputting said sub test patterns from pattern calculators.

23. A memory testing device for testing electrical characteristic of a memory by comparing an output signal output from said memory when a predetermined signal is input to said memory with an expected signal output from a normal memory when said predetermined signal is input to said normal memory comprising:

a control memory for storing a plural kinds of control instructions to generate a plurality of test patterns including said input signal and said expected signal;

a vector memory for storing vector instructions indicating an order of said control instructions to be read out from said control memory;

a plurality of bank memories for storing said vector instructions read out from said vector memory, each of said bank memories storing each of said vector instructions in order;

an address expander for generating an address of each of said control instructions in said control memory in accordance with said vector instructions stored in said plurality of bank memories;

a test pattern calculator for generating said test patterns based on said control instructions stored in said control memory indicated by said address generated by said address expander;

a pin data selector for changing said test patterns generated by said test pattern calculator so as to correspond to pin arrangements of said memory;

a waveform generator for generating said test patterns changed by said pin data selector;

a memory acceptor comprising a memory slot to accept said memory, applying said test patterns generated by said waveform generator to said memory, and receiving said output signal output from said memory; and a comparing unit for judging whether or not said memory is normal by comparing said output signal received by said memory acceptor with said expected signal output from said pin data selector.

24. A memory testing device as set forth in claim 23, wherein each of said vector instructions read out from said vector memory are stored in each of said plurality of bank memories in order, and wherein said address expander reads out said vector instructions stored in said plurality of bank memories at the same time to generate an address of said control instructions in said control memory.

25. A memory testing device as set forth in claim 23, wherein said control memory comprises a plurality of sub control memories storing substantially same control instructions, and wherein said address expander reads out said vector instructions stored in said vector memory to generate an address of said control instructions in each of said plurality of sub control memories in order, for each of said plurality of sub control memories.

26. A memory testing device as set forth in claim 25, wherein said test pattern calculator comprises:

sub test patterns based on said control instructions read out from said address of one of said sub control memories generated by said address expander, said sub test patterns being a part of said test patterns; and a high speed converter for generating said test patterns by outputting said sub test patterns from pattern calculators.

27. A memory testing device as set forth in claim 23, wherein said control memory comprises a plurality of sub control memories, each of said sub control memories storing a control instruction for generating a new test pattern based on an earlier test pattern generated at least two cycles ahead of said new test pattern, and wherein said address expander reads out said vector instructions stored in said vector memory to generate an address of said control instructions in each of said plurality of sub control memories in order, for each of said plurality of sub control memories.

28. A memory testing device for testing electrical characteristic of a memory by comparing an output signal output from said memory when a predetermined signal is input to said memory with an expected signal output from a normal memory when said predetermined signal is input to said normal memory comprising:

a control memory for storing a plural kinds of control instructions to generate a plurality of test patterns including said input signal and said expected signal;

a vector memory for storing vector instructions indicating an order of said control instructions to be read out from said control memory;

a plurality of bank memories for storing said vector instructions read out from said vector memory;

an address expander for generating an address of each of said control instructions in said control memory in accordance with said vector instructions stored in said plurality of bank memories;

a test pattern calculator for generating said test patterns based on said control instructions stored in said control memory indicated by said address generated by said address expander; and a memory acceptor applying said test patterns generated by said test pattern calculator to said memory, and receiving said output signal output from said memory.

29. A memory testing device as set forth in claim 28, wherein each of said vector instructions read out from said vector memory are stored in each of said plurality of bank memories in order, and wherein said address expander reads out said vector instructions stored in said plurality of bank memories at the same time to generate an address of said control instructions in said control memory.

30. A memory testing device as set forth in claim 28, wherein said control memory comprises a plurality of sub control memories storing substantially same control instructions, and wherein said address expander reads out said vector instructions stored in said vector memory to generate an address of said control instructions in each of said plurality of sub control memories in order, for each of said plurality of sub control memories.

31. A memory testing device as set forth in claim 30, wherein said test pattern calculator comprises:

sub test patterns based on said control instructions read out from said address of one of said sub control memories generated by said address expander, said sub test patterns being a part of said test patterns; and a high speed converter for generating said test patterns by outputting said sub test patterns from pattern calculators.

32. A memory testing device as set forth in claim 28, wherein said control memory comprises a plurality of sub control memories, each of said sub control memories storing a control instruction for generating a new test pattern based on an earlier test pattern generated at least two cycles ahead of said new test pattern, and wherein said address expander reads out said vector instructions stored in said vector memory to generate an address of said control instructions in each of said plurality of sub control memories in order, for each of said plurality of sub control memories.

33. A memory testing device for testing electrical characteristics of a memory by comparing an output signal output from said memory when a predetermined signal is input to said memory with an expected signal output from a normal memory when said predetermined signal is input to said normal memory comprising:

a plurality of sub control memories for storing a plural kinds of control instructions to generate a plurality of test patterns including said input signal and said expected signal, said plurality of sub control memories storing substantially same control instructions;

a vector memory for storing vector instructions indicating an order of said control instructions to be read out from said plurality of sub control memories;

an address expander for generating addresses of said control instructions in each of said plurality of sub control memories for each of said plurality of sub control memories in accordance with said vector instructions stored in said vector memory;

a test pattern calculator for generating said test patterns based on said control instructions stored in said plurality of sub control memories indicated by said address generated by said address expander; and a memory acceptor applying said test patterns generated by said test pattern calculator to said memory, and receiving said output signal output from said memory.

34. A memory testing device as set forth in claim 33, wherein said plurality of sub control memories store substantially same control instructions to generate a new test pattern based on an earlier test pattern generated at least two cycles ahead of said new test pattern.

35. A memory testing device as set forth in claim 33, further comprises a vector cache memory for storing said vector instructions read out from said vector memory, wherein said address expander generates an address of said control instructions in said plurality of sub control memories in accordance with said vector instructions stored in said vector cache memory.

36. A memory testing device as set forth in claim 33, wherein said vector cache memory comprises a plurality of bank memories for storing said vector instructions read out from said vector memory, each of said bank memories storing each of said vector instructions in order, and wherein said address expander generates the address of said control instructions in said plurality of sub control memories in accordance with said vector instructions stored in said vector cache memory.

37. A memory testing device as set forth in claim 33, wherein said vector cache memory comprises a plurality of bank memories for storing said vector instructions read out from said vector memory, and wherein said address expander generates the address of said control instructions in said plurality of sub control memories in accordance with said vector instructions stored in said vector cache memory.

38. A memory testing device as set forth in claim 33, wherein said test pattern calculator comprises:

sub test patterns based on said control instructions read out from said address of one of said sub control memories generated by said address expander, said sub test patterns being a part of said test patterns; and a high speed converter for generating said test patterns by outputting said sub test patterns from pattern calculators.

39. A memory testing device for testing electrical characteristics of a memory by comparing an output signal output from said memory when a predetermined signal is input to said memory with an expected signal output from a normal memory when said predetermined signal is input to said normal memory comprising:

a control memory for storing a plural kinds of control instructions to generate a plurality of test patterns including said input signal and said expected signal;

a plurality of sub control memories for storing a control instruction for generating a new test pattern based on an earlier test pattern generated at least 2 cycles ahead of said new control instruction;

a vector memory for storing vector instructions indicating an order of said control instructions to be read out from said plurality of control memories;

an address expander for generating addresses of said control instructions in each of said plurality of sub control memories for each of said plurality of sub control memories in accordance with said vector instructions stored in said vector memory; and a test pattern calculator for generating said test patterns based on said control instructions stored in said plurality of sub control memories indicated by said address generated by said address expander; and a memory acceptor applying said test patterns generated by said test pattern calculator to said memory, and receiving said output signal output from said memory.

40. A memory testing device as set forth in claim 39, wherein said plurality of sub control memories store substantially same control instructions to generate a new test pattern based on an earlier test pattern generated at least two cycles ahead of said new test pattern.

41. A memory testing device as set forth in claim 39, further comprises a vector cache memory for storing said vector instructions read out from said vector memory, wherein said address expander generates an address of said control instructions in said plurality of sub control memories in accordance with said vector instructions stored in said vector cache memory.

42. A memory testing device as set forth in claim 39, wherein said vector cache memory comprises a plurality of bank memories for storing said vector instructions read out from said vector memory, each of said bank memories storing each of said vector instructions in order, and wherein said address expander generates the address of said control instructions in said plurality of sub control memories in accordance with said vector instructions stored in said vector cache memory.

43. A memory testing device as set forth in claim 39, wherein said vector cache memory comprises a plurality of bank memories for storing said vector instructions read out from said vector memory, and wherein said address expander generates the address of said control instructions in said plurality of sub control memories in accordance with said vector instructions stored in said vector cache memory.

44. A memory testing device as set forth in claim 39, wherein said test pattern calculator comprises:

sub test patterns based on said control instructions read out from said address of one of said sub control memories generated by said address expander, said sub test patterns being a part of said test patterns; and a high speed converter for generating said test patterns by outputting said sub test patterns from pattern calculators.

45. A method for generating a plurality of test patterns to test a memory, comprising:

a first storing step of storing a plural kinds of control instructions to generate said test patterns into a control memory;

a reading out step of reading out said control instructions from a vector memory storing vector instructions indicating an order of said control instructions to be read out from said control memory;

a second storing step of storing said vector instructions read out from said vector memory into a plurality of bank memories, said vector instructions being alternately stored into said bank memories;

an address generating step of generating an address of each of said control instructions in said control memory in accordance with said vector instructions stored in said plurality of bank memories; and a pattern generating step of generating said test patterns based on said control instructions, indicated by said address and stored in said control memory.

46. A method as set forth in claim 45, wherein said second storing step stores each of said vector instructions read out from said vector memory into each of said plurality of bank memories in order, and wherein said address generating step generates an address of said control instructions in said control memory in accordance with said vector instructions stored in said plurality of bank memories at the same time.

47. A method as set forth in claim 45, wherein said control memory comprises a plurality of sub control memories storing substantially same control instructions, and wherein said address generating step generates an address of said control instructions in each of said plurality of sub control memories in order for each of said plurality of sub control memories.

48. A method as set forth in claim 47, wherein said test pattern step comprises steps of:

generating sub test patterns based on said control instructions read out from said address of one of said sub control memories generated by said address expander, said sub test patterns being a part of said test patterns; and generating said test patterns by outputting said sub test patterns.

49. A method as set forth in claim 45, wherein said control memory comprises a plurality of sub control memories, each of said sub control memories storing a control instruction for generating a new test pattern based on an earlier test pattern generated at least two cycles ahead of said new test pattern, and wherein said address generating step generates an address of said control instructions in each of said plurality of sub control memories in order for each of said plurality of sub control memories.

50. A method for generating a plurality of test patterns to test a memory, comprising:

a first storing step of storing a plural kinds of control instructions to generate said test patterns into a control memory;

a reading out step of reading out said control instructions from a vector memory storing vector instructions, indicating an order of said control instructions to be read out from said control memory;

a second storing step of storing said vector instructions read out from said vector memory into a plurality of bank memories;

an address generating step of generating an address of each of said control instructions in said control memory in accordance with said vector instructions stored in said plurality of bank memories; and a pattern generating step of generating said test patterns based on said control instructions indicated by said address and stored in said control memory.

51. A method as set forth in claim 50, wherein said second storing step stores each of said vector instructions read out from said vector memory into each of said plurality of bank memories in order, and wherein said address generating step generates an address of said control instructions in said control memory in accordance with said vector instructions stored in said plurality of bank memories at the same time.

52. A method as set forth in claim 50, wherein said control memory comprises a plurality of sub control memories storing substantially same control instructions, and wherein said address generating step generates an address of said control instructions in each of said plurality of sub control memories in order for each of said plurality of sub control memories.

53. A method as set forth in claim 52, wherein said test pattern step comprises steps of:

generating sub test patterns based on said control instructions read out from said address of one of said sub control memories generated by said address expander, said sub test patterns being a part of said test patterns; and generating said test patterns by outputting said sub test patterns.

54. A method as set forth in claim 50, wherein said control memory comprises a plurality of sub control memories, each of said sub control memories storing a control instruction for generating a new test pattern based on an earlier test pattern generated at least two cycles ahead of said new test pattern, and wherein said address generating step generates an address of said control instructions in each of said plurality of sub control memories in order for each of said plurality of sub control memories.

55. A method for generating a plurality of test patterns to test a memory, comprising:

a storing step of storing substantially same instructions into a plurality of sub control memories to generate said test patterns;

a read out step of reading out vector instructions indicating an order of said control instructions to be read out from said plurality of sub control memories from said vector memory;

an address generating step of generating an address of each of said control instructions in each of said sub control memories for each of said sub control memories in accordance with said vector instructions stored in said vector memory; and a test pattern generating step of generating said test patterns based on said control instructions stored in said plurality of sub control memories indicated by said address.

56. A method as set forth in claim 55, wherein said storing step generates substantially same control instructions to generate a new test pattern based on an earlier test pattern generated at least two cycles ahead of said new test pattern into said plurality of sub control memories.

57. A method as set forth in claim 55, wherein said read out step stores said vector instructions read out from said vector memory into a vector cache memory, wherein said address generating step generates an address of said control instructions in said plurality of sub control memories in accordance with said vector instructions stored in said vector cache memory.

58. A method as set forth in claim 55, wherein said vector cache memory comprises a plurality of bank memories for storing said vector instructions read out from said vector memory, each of said bank memories storing each of said vector instructions in order, and wherein said address generating step generates an address of said control instructions in said plurality of sub control memories in accordance with said vector instructions stored in said vector cache memory.

59. A method as set forth in claim 55, wherein said vector cache memory comprises a plurality of bank memories for storing said vector instructions read out from said vector memory, and wherein said address generating step generates an address of said control instructions in said plurality of sub control memories in accordance with said vector instructions stored in said vector cache memory.

60. A method as set forth in claim 55, wherein said test pattern step comprises steps of:

generating sub test patterns based on said control instructions read out from said address of one of said sub control memories generated by said address expander, said sub test patterns being a part of said test patterns; and generating said test patterns by outputting said sub test patterns.

61. A method for generating a plurality of test patterns to test a memory, comprising:

a storing step of storing a control instruction for generating a new test pattern based on an earlier test pattern generated at least two cycles ahead of said new test pattern into a plurality of sub control memories;

a reading out step of reading out vector instructions stored in a vector memory and indicating an order of said control instructions to be read out from said plurality of sub control memories;

an address generating step of generating an address of each of said control instructions in each of said sub control memories for each of said sub control memories in accordance with said vector instructions stored in said vector memory; and a test pattern generating step of generating said test patterns based on said control instructions stored in said plurality of sub control memories indicated by said address.

62. A method as set forth in claim 61, wherein said storing step generates substantially same control instructions to generate a new test pattern based on an earlier test pattern generated at least two cycles ahead of said new test pattern into said plurality of sub control memories.

63. A method as set forth in claim 61, wherein said read out step stores said vector instructions read out from said vector memory into a vector cache memory, wherein said address generating step generates an address of said control instructions in said plurality of sub control memories in accordance with said vector instructions stored in said vector cache memory.

64. A method as set forth in claim 61, wherein said vector cache memory comprises a plurality of bank memories for storing said vector instructions read out from said vector memory, each of said bank memories storing each of said vector instructions in order, and wherein said address generating step generates an address of said control instructions in said plurality of sub control memories in accordance with said vector instructions stored in said vector cache memory.

65. A method as set forth in claim 61, wherein said vector cache memory comprises a plurality of bank memories for storing said vector instructions read out from said vector memory, and wherein said address generating step generates an address of said control instructions in said plurality of sub control memories in accordance with said vector instructions stored in said vector cache memory.

66. A method as set forth in claim 61, wherein said test pattern step comprises steps of:

generating sub test patterns based on said control instructions read out from said address of one of said sub control memories generated by said address expander, said sub test patterns being a part of said test patterns; and generating said test patterns by outputting said sub test patterns.

\* \* \* \* \*